US012765215B2

(12) United States Patent
Li

(10) Patent No.: US 12,765,215 B2
(45) Date of Patent: Oct. 13, 2026

(54) QUANTUM DOT FILM LAYER PATTERNING METHOD, QUANTUM DOT LIGHT EMITTING DEVICE

(71) Applicants: Beijing BOE Technology Development Co., Ltd., Beijing (CN); BOE TECHNOLOGY GROUP CO., LTD., Beijing (CN)

(72) Inventor: Zhuo Li, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 338 days.

(21) Appl. No.: 18/703,473

(22) PCT Filed: Mar. 22, 2023

(86) PCT No.: PCT/CN2023/083178
§ 371 (c)(1),
(2) Date: Apr. 22, 2024

(87) PCT Pub. No.: WO2024/192734
PCT Pub. Date: Sep. 26, 2024

(65) Prior Publication Data

US 2025/0241164 A1 Jul. 24, 2025

(51) Int. Cl.
*H10K 59/38* (2023.01)
*B82Y 20/00* (2011.01)
(Continued)

(52) U.S. Cl.
CPC .............. *H10K 59/38* (2023.02); *B82Y 20/00* (2013.01); *B82Y 40/00* (2013.01); *C09K 11/02* (2013.01);
(Continued)

(58) Field of Classification Search
CPC .................................................... H10K 50/115
See application file for complete search history.

(56) References Cited

U.S. PATENT DOCUMENTS

2019/0305240 A1* 10/2019 Angioni ................. H10K 50/18
2022/0393061 A1* 12/2022 Boardman ........... H10K 71/233
2024/0423006 A1* 12/2024 Li .......................... H10K 59/38

FOREIGN PATENT DOCUMENTS

CN 104835783 A 5/2015
CN 105829103 A 8/2016
(Continued)

OTHER PUBLICATIONS

International Search Report of PCT application No. PCT/CN2023/083178 dated Oct. 27, 2023.
(Continued)

*Primary Examiner* — Benjamin P Sandvik
(74) *Attorney, Agent, or Firm* — Calfee, Halter & Griswold LLP

(57) ABSTRACT

The present disclosure provides a quantum dot film layer patterning method and a quantum dot light emitting device, and relate to a field of display technology. The quantum dot film layer patterning method includes: forming a quantum dot material layer on a side of a substrate; forming an organic material layer on one side of the quantum dot material layer away from the substrate, wherein the organic material layer has a transmittance of not less than 80% in UV and visible light bands; exposing a preset area of the substrate to cause crosslinking of the material in the preset area of the quantum dot material layer or the generation of salts insoluble in the developer, or/and to cause crosslinking of the material in the preset area of the organic material layer; removing the organic material layer and the quantum dot material layer from a non-preset area of the substrate, to
(Continued)

slow down the PLQY decrease of the quantum dot material layer.

39 Claims, 11 Drawing Sheets

(51) Int. Cl.

| | |
|---|---|
| ***B82Y 40/00*** | (2011.01) |
| ***C09K 11/02*** | (2006.01) |
| ***H10K 50/115*** | (2023.01) |
| ***H10K 50/14*** | (2023.01) |
| ***H10K 59/12*** | (2023.01) |
| ***H10K 59/122*** | (2023.01) |
| ***H10K 71/20*** | (2023.01) |

(52) U.S. Cl.
CPC ........... *H10K 50/115* (2023.02); *H10K 50/14* (2023.02); *H10K 59/1201* (2023.02); *H10K 59/122* (2023.02); *H10K 71/20* (2023.02)

(56) References Cited

FOREIGN PATENT DOCUMENTS

| | | | |
|---|---|---|---|
| CN | 107761052 | A | 3/2018 |
| CN | 109937491 | A | 6/2019 |
| CN | 111725408 | A | 9/2020 |
| CN | 113972343 | A | 1/2022 |
| JP | 2013239690 | A | 11/2013 |
| JP | 2016194558 | A | 11/2016 |

OTHER PUBLICATIONS

Written Opinion of PCT application No. PCT/CN2023/083178 dated Oct. 27, 2023.

* cited by examiner

QUANTUM DOT FILM LAYER PATTERNING METHOD, QUANTUM DOT LIGHT EMITTING DEVICE

CROSS-REFERENCE TO RELATED APPLICATION

The present application is based on PCT filing PCT/CN2023/083178, filed Mar. 22, 2023, the entire contents of which are incorporated herein by reference.

TECHNICAL FIELD

The present disclosure relates to the field of display technology, and specifically to a quantum dot film layer patterning method and a quantum dot light emitting device.

BACKGROUND

Quantum Dot Light Emitting Diodes (QLED) QLED, as the most promising next-generation self-luminous display technology, has the outstanding advantages of lower energy consumption, higher color purity, and wider color gamut than OLED technology, and the precise preparation of sub-pixel areas in QLED is the prerequisite for realizing high-resolution display devices. The patterned preparation of quantum dot film on substrate through photolithography and developing processes is an effective way to realize high pixel density (high-resolution) of self-luminous QLED display products.

Currently, the technology for forming quantum dot film layers needs to be further improved.

It should be noted that the information disclosed in the Background section above is only for enhancing the understanding of the background of the present disclosure, and thus may include information that does not constitute prior art known to those of ordinary skill in the art.

SUMMARY

It is an object of the present disclosure to provide a quantum dot film layer patterning method, and a quantum dot light emitting device.

In order to realize the above inventive purpose, the present disclosure adopts the following technical solutions:

According to a first aspect of the present disclosure, there is provided a quantum dot film layer patterning method, including:

- forming a quantum dot material layer on a side of a substrate;
- forming an organic material layer on one side of the quantum dot material layer away from the substrate, wherein the organic material layer has a transmittance of not less than 80% in UV and visible light bands;
- exposing a preset area of the substrate to cause crosslinking of the material in the preset area of the quantum dot material layer or the generation of salts insoluble in the developer, or/and to cause crosslinking of the material in the preset area of the organic material layer;
- removing the organic material layer and the quantum dot material layer from a non-preset area of the substrate.

In an exemplary example of the present disclosure, the material of the organic layer includes a hydrocarbon mixture with 18-30 carbon atoms.

In an exemplary example of the present disclosure, the material of the organic material layer further includes a first photosensitive crosslinking agent.

In an exemplary example of the present disclosure, the hydrocarbon mixture includes 80-100% by weight of straight chain alkane and 0-20% by weight of other hydrocarbons, the other hydrocarbons including branched alkanes, cycloalkanes, olefins, alkynes or a combination thereof.

In an exemplary example of the present disclosure, the photosensitive crosslinking agent accounts for 1-30% by weight of the hydrocarbon mixture.

In an exemplary example of the present disclosure, the material of the organic material layer includes waxes.

In an exemplary example of the present disclosure, the material of the organic material layer has an initial melting temperature of not more than 60° C.

In an exemplary example of the present disclosure, the organic material layer has an initial thickness of 20 nm-80 nm.

In an exemplary example of the present disclosure, the material of the quantum dot material layer includes a first quantum dot body, a second quantum dot body, a quantum dot ligand, and a second photosensitive crosslinking agent;

- the quantum dot ligand is connected to the first quantum dot body or/and the second quantum dot body via a coordination bond;
- the quantum dot ligand includes a first photosensitive group at the terminal of the molecular structure of the quantum dot ligand, and the second photosensitive crosslinking agent is used to induce crosslinking reaction of the first photosensitive group.

In an exemplary example of the present disclosure, the first photosensitive group includes a carbon-carbon double bond, or a saturated 3 to 5-membered heterocyclic structure containing O or S.

In an exemplary example of the present disclosure, the material of the quantum dot material layer includes a first quantum dot body, a second quantum dot body, a quantum dot ligand, and a photosensitive initiator;

- the quantum dot ligand includes a first quantum dot ligand and a second quantum dot ligand, the first quantum dot ligand is connected to the first quantum dot body via a coordination bond and the second quantum dot ligand is connected to the second quantum dot body via a coordination bond;
- the first quantum dot ligand includes a cross-linkable group at the terminal of the molecular structure of the first quantum dot ligand, and the second quantum dot ligand includes a second photosensitive group with a structure of -A-B, wherein A is an imino group and B is a protective group;
- under light conditions, the second photosensitive group can remove the protective group to form an amino group under the action of the photosensitive initiator; the cross-linkable group can form crosslinking or salts insoluble in the developer with the amino group formed by removing the protective group from the second photosensitive group; or the cross-linkable group can be activated by an activator to form crosslinking or salts insoluble in developer with the amino group formed by removing the protective group from the second photosensitive group.

In an exemplary example of the present disclosure, the cross-linkable group is selected from an epoxy group, a carboxylic acid group or a sulfonic acid group.

In an exemplary example of the present disclosure, the material of the quantum dot material layer includes a quantum dot body and a quantum dot ligand, the quantum dot ligand includes a coordination group, and the quantum dot ligant is connected to the quantum dot body by the coordination group;

the quantum dot ligand includes a structure of —Y—Z, wherein Z is a solubility group, and the solubility group is selected from polar groups; Y includes an interconnected connecting group and a third photosensitive group, and the connecting group is connected between the coordination group and the third photosensitive group; the connecting group is selected from alkylene groups;

the third photosensitive group can undergo bond breaking under light conditions to decompose the interconnected quantum dot body and quantum dot ligand into a first material containing the interconnected quantum dot body, the coordination group, and the connecting group, as well as a second material containing the solubility group;

the second material can dissolve in the developer and the first material is insoluble in the developer.

In an exemplary example of the present disclosure, the material of the quantum dot material layer includes a first quantum dot body, a second quantum dot body, a quantum dot ligand, and a third photosensitive crosslinking agent;

the quantum dot ligand is connected to the first quantum dot body or/and the second quantum dot body via a coordination bond, and the quantum dot ligand contains an alkane chain;

the third photosensitive crosslinking agent includes at least two fourth photosensitive groups at the terminal of the molecular structure of the third photosensitive crosslinking agent;

the fourth photosensitive group can undergo a hydrocarbon insertion reaction with the alkane chain in the quantum dot ligand under light conditions.

In an exemplary example of the present disclosure, the fourth photosensitive group is selected from a structure containing a benzophenone group, an azide group, a diazo group, or a diazirine group.

In an exemplary example of the present disclosure, the material of the quantum dot material layer includes a quantum dot body and at least one quantum dot ligand, and the quantum dot ligand is connected to the quantum dot body via a coordination bond;

at least one of the quantum dot ligands includes an alkane chain in their molecular structure.

In an exemplary example of the present disclosure, the quantum dot material layer and the organic material layer are formed in an inert gas or in a vacuum environment;

the step of exposing the preset area of the substrate is performed in an atmospheric environment.

In an exemplary example of the present disclosure, the step of removing the organic material layer and the quantum dot material layer from the non-preset area of the substrate includes:

developing to remove the organic material layer and the quantum dot material layer from the non-preset area;

wherein the organic material layer in the preset area undergoes crosslinking during exposure.

In an exemplary example of the present disclosure, developing to remove the organic material layer and the quantum dot material layer from the non-preset area of the substrate includes:

performing a first development by a first developer to remove the organic material layer from the non-preset area;

performing a second development by a second developer to remove the quantum dot material layer from the non-preset area;

wherein the first developer is different from the second developer.

In an exemplary example of the present disclosure, the step of removing the organic material layer and the quantum dot material layer from the non-preset area of the substrate includes:

heating the non-preset area, and rotating the substrate to melt the organic material layer in the non-preset area and remove the melted organic material layer under the action of centrifugal force;

developing to remove the quantum dot material layer in the non-preset area;

wherein the quantum dot material layer in the preset area undergoes crosslinking or generates salts insoluble in the developer during exposure.

In an exemplary example of the present disclosure, the step of removing the organic material layer and the quantum dot material layer from the non-preset area of the substrate includes:

removing at least part of the organic material layer in the preset area and at least part of the organic material layer in the non-preset area by a first solvent, wherein the first solvent is at a temperature of 60° C.-90° C.;

developing to remove the quantum dot material layer in the non-preset area by a second developer;

wherein the quantum dot material layer in the preset area undergoes crosslinking or generates salts insoluble in the developer during exposure.

In an exemplary example of the present disclosure, the temperature of the first developer is less than 60° C.;

the relative dielectric constant of the second developer is greater than the relative dielectric constant of the first developer.

In an exemplary example of the present disclosure, the temperature for heating the non-preset area is 70° C.-110° C.

In an exemplary example of the present disclosure, after being treated with the first solvent, the thickness of the organic material layer is not greater than 3 nm, or pores appear in the organic material layer.

In an exemplary example of the present disclosure, the step of removing the organic material layer and the quantum dot material layer from the non-preset area of the substrate further includes:

placing the substrate in horizontal direction, annealing it at 60° C.-100° C. for 5 min-30 min, then cooling it to below 35° C.

In an exemplary example of the present disclosure, after the step of removing the organic material layer and the quantum dot material layer from the non-preset area of the substrate, the method further includes:

removing at least a portion of the organic material layer from the preset area by a second solvent, wherein the second solvent is at a temperature of 60° C.-90° C.;

heating to dry the substrate.

In an exemplary example of the present disclosure, after the step of removing the organic material layer and the quantum dot material layer from the non-preset area of the substrate, the method further includes:

heating the substrate and rotating it, rinsing the rotated substrate by a third solvent to remove at least a portion of the remaining organic material layer, wherein the third solvent is at a temperature of 70° C.-110° C.;

heating to dry the substrate.

In an exemplary example of the present disclosure, the first photosensitive crosslinking agent molecular structure contains at least two fifth photosensitive groups at the terminal of the molecular structure of the first photosensitive crosslinking agent;

the fifth photosensitive group is selected from a structure containing a benzophenone group, an azide group, a diazo group, or a diazirine group.

In an exemplary example of the present disclosure, the substrate includes:

a base substrate;

a pixel definition layer disposed on one side of the base substrate, wherein the pixel definition layer has a plurality of openings, and the quantum dot material layer is at least partially formed within openings;

wherein in a direction perpendicular to the base substrate, the pixel definition layer has a height of no more than 1.5 μm.

According to a second aspect of the present disclosure, there is provided a quantum dot light emitting layer produced by the quantum dot film layer patterning method as described in the first aspect.

According to a third aspect of the present disclosure, there is provided a quantum dot light emitting device including a quantum dot light emitting layer as described in the second aspect.

In an exemplary example of the present disclosure, a quantum dot light emitting device includes:

a base substrate;

a pixel definition layer on one side of the substrate, wherein the pixel definition layer has a plurality of openings;

a quantum dot light emitting layer on one side of the substrate and within openings;

an organic layer on one side of the quantum dot light emitting layer away from the base substrate, wherein the organic layer has a transmittance of not less than 80% in the ultraviolet and visible light bands, and the material in the organic layer has a melting temperature of no more than 110° C.

In an exemplary example of the present disclosure, the organic layer has a thickness of no more than 20 nm.

In an exemplary example of the present disclosure, the organic layer has a thickness of no more than 3 nm and the organic material layer within each opening is a discontinuous film layer having a plurality of pores.

In an exemplary example of the present disclosure, the material of the organic layer includes waxes.

In an exemplary example of the present disclosure, the quantum dot light emitting layer has a cross-linked network structure, or/and the organic layer has a cross-linked network structure or salts insoluble in the developer.

In an exemplary example of the present disclosure, the quantum dot light emitting device further includes a first electrode, a second electrode, a first carrier transport layer, and a second carrier transport layer;

the first electrode is disposed between the base substrate and the quantum dot light emitting layer, and the first carrier transport layer is disposed between the first electrode and the quantum dot light emitting layer;

the second carrier transport layer is disposed on a side of the organic layer away from the base substrate, and the second electrode is disposed on a side of the second carrier transport layer away from the base substrate.

The quantum dot film layer patterning method provided in the present disclosure forms the organic material layer on the surface of the quantum dot material layer before exposure, which can protect the quantum dot material layer. During exposure, it helps to slow down the decrease in PLQY of the quantum dot material layer, providing foundation for the production of high-efficiency and high-performance QLED devices.

BRIEF DESCRIPTION OF THE DRAWINGS

The above and other features and advantages of the present disclosure will become more apparent by referring to the detailed description of the exemplary embodiments in the accompanying drawings.

Figure 1:
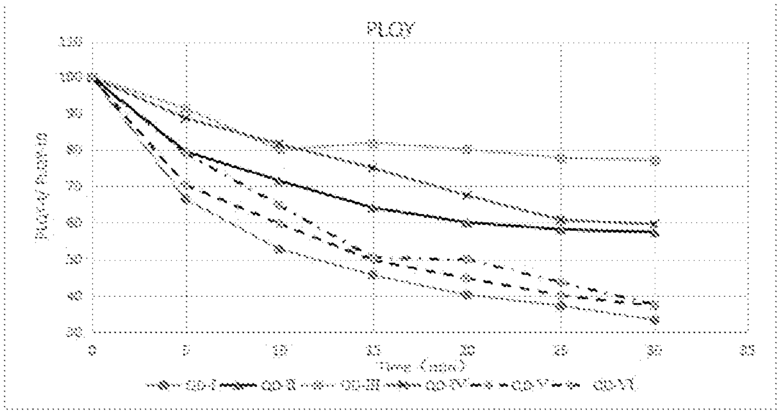
FIG. 1 is a schematic diagram of PLQY variations of the quantum dot film during exposure in the related art.

Reference signs of main elements in the figures are described as follows:

100—substrate; 101—base substrate; 110—first electrode; 120—pixel definition layer; 130—first carrier transport layer; 200—quantum dot material layer; 300—organic material layer; 400—second carrier transport layer; 500—second electrode; 600—encapsulation layer.

DETAILED DESCRIPTION

Example embodiments will now be described more fully with reference to the accompanying drawings. However, the example embodiments can be implemented in various forms, and should not be construed as being limited to the embodiments set forth herein. On the contrary, these embodiments are provided so that the disclosure will be comprehensive and complete, and fully convey the concept of the example embodiments to those skilled in the art. The described features, structures, or characteristics can be combined in one or more embodiments in any suitable manner. In the following description, many specific details are provided to provide a full understanding of the disclosed embodiments.

In the figure, the thickness of the region and layer may have been exaggerated for clarity. The same reference numerals in the figure represent the same or similar structures, therefore their detailed descriptions will be omitted.

The described features, structures, or characteristics can be combined in one or more embodiments in any suitable manner. In the following description, many specific details are provided to provide a full understanding of the embodiments of the disclosure. However, those skilled in the art will be mean that the disclosed technical solution can be practiced without one or more of the specific details described, or other methods, components, materials, and the like may be employed. In other cases, the well-known structures, materials, or operations are not shown or described in detail to avoid blurring the main technical ideas disclosed in the disclosure.

When a certain structure is "on" other structures, it may refer to a structure being formed as a whole on other structures, or a structure being "directly" disposed on other structures, or a structure being "indirectly" disposed on other structures through another structure.

The terms "a", "one", "the" are used to indicate the existence of one or more elements/components/and the like. The terms "including" and "comprising" are used to indicate open inclusion and refer to the existence of additional elements/components/and the like in addition to the listed ones. The terms "first" and "second" are only used as markers and do not limit the number of their objects.

In related technologies, in order to achieve high performance of QLED devices, many functional layers, including quantum dot layers, are usually coated or deposited in an inert atmosphere (some processes are in a vacuum environment), for example, common processes such as spin coating or inkjet printing are carried out in a nitrogen atmosphere. In the process of preparing patterned quantum dot thin films through photolithography, mature semiconductor process equipment is used for both the exposure process (lithography machine) and the development process (development equipment) used are. However, the above-mentioned mature related semiconductor equipment is carried out in an air (or atmospheric) environment. To establish photolithography and/or development equipment in an inert gas atmosphere will be a huge equipment development cost and not practical. Therefore, the patterned preparation of quantum dots using photolithography requires exposure to an air atmosphere for related process processes. The practical problem is that within 0-30 minutes after exposure to the atmosphere, the photoluminescence quantum yield (PLQY) of quantum dot materials will significantly decrease, with the most severe cases decreasing by more than 70%. Please refer to the experimental data shown in FIG. 1 for details.

In FIG. 1, quantum dot films were prepared by spin coating different quantum dot solutions on a glass substrate, and the PLQY (photoluminescence quantum yield) of the quantum dot films was measured every 5 minutes using an integrating sphere. In FIG. 1, the vertical axis represents the ratio of the quantum dot film PLQY (recorded as PLQY-t) at time t to the PLQY (recorded as PLQY-t0) at time 0 after spin coating the quantum dot film, and the horizontal axis represents different time values. QD-I~QD-VI represent different quantum dot samples. The experimental results reflect the decreasing trend of PLQY of quantum dot thin films in air over time. The results showed that after 5 minutes of exposure to the atmosphere, the PLQY of QD film significantly decreased (by 10%~35%). Although the rate of PLQY decrease gradually slowed down after 15 minutes-20 minutes, PLQY has decreased by 20%~60%. After 30 minutes, the lowest PLQY can be reduced by about 70%, which is very unfavorable for improving the efficiency of QLED devices. Due to the huge cost of transferring lithography processes to inert gas atmospheres (such as nitrogen glove boxes) in practice, it is also not practical. Therefore, how to make the preparation of photolithography quantum dot patterned thin films that can withstand atmospheric environments is a necessary condition for achieving high-efficiency and high-performance QLED devices.

Figure 3:
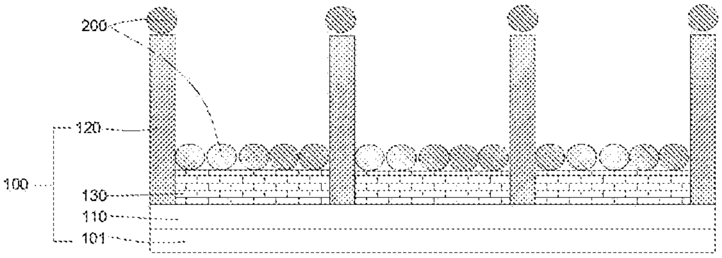
FIG. 3 is a schematic diagram of the structure of forming the quantum dot material layer 200 in an exemplary example of the present disclosure.
Figure 4:
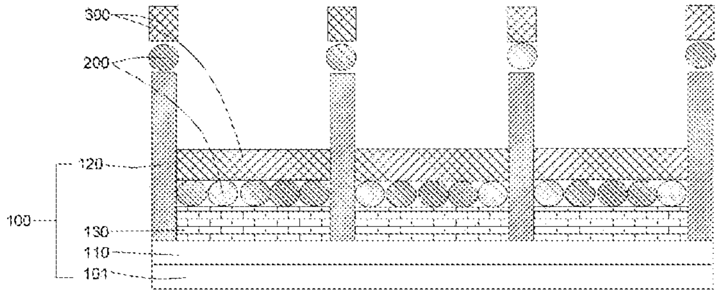
FIG. 4 is a schematic diagram of the structure of forming an organic material layer 300 in an exemplary example of the present disclosure.
Figure 5:
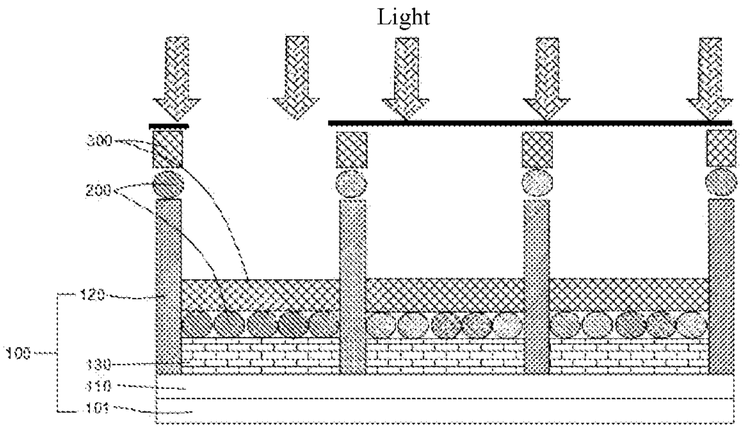
FIG. 5 is a schematic diagram of the exposure structure in an exemplary example of the present disclosure.
Figure 6:
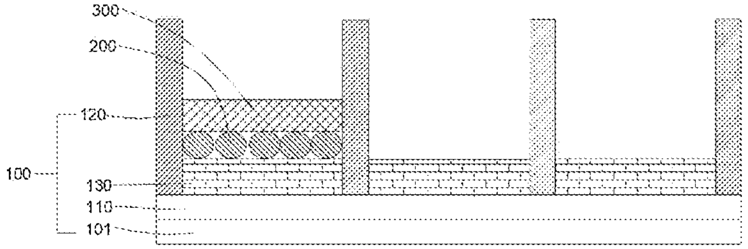
FIG. 6 is a schematic diagram of the structure of removing the organic material layer 300 and the quantum dot material layer 200 from the non-preset area in an exemplary example of the disclosure.

As shown in FIGS. 2 to 6, an embodiment of the present disclosure provides a quantum dot film layer patterning method, the method can be used to form quantum dot light emitting devices, and the quantum dot film layer patterning method includes:

Step S100, forming a quantum dot material layer 200 on one side of a substrate 100, as shown in FIG. 3;

Step S200, forming an organic material layer 300 on the side of the quantum dot material layer 200 away from the substrate 100, wherein the organic material layer 300 has a transmittance of not less than 80% in the ultraviolet and visible light bands, as shown in FIG. 4;

Step S300, exposing a preset area of the substrate 100 to cause the material of the quantum dot material layer 200 in the preset area crosslink or generate salts insoluble in the developer, or/and to cause the material of the organic material layer 300 in the preset area crosslink, as shown in FIG. 5;

Step S400, removing the organic material layer 300 and the quantum dot material layer 200 from the non-preset area of the substrate 100, as shown in FIG. 6.

The quantum dot film layer patterning method provided in the present disclosure forms the organic material layer 300 on the surface of the quantum dot material layer 200 before exposure, which can protect the quantum dot material layer 200. During exposure, it helps to slow down the decrease in PLQY of the quantum dot material layer 200, providing foundation for the production of high-efficiency and high-performance QLED devices.

The steps of the quantum dot film layer patterning method provided by embodiments of the present disclosure are described in detail below in conjunction with the accompanying drawings.

Figure 2:
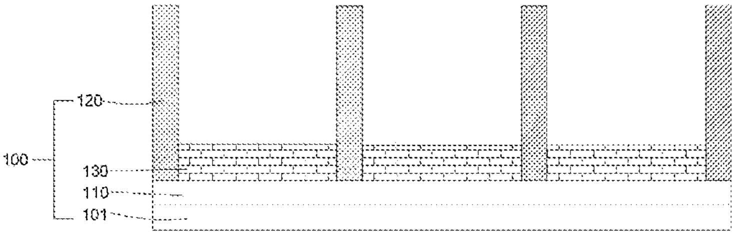
FIG. 2 is a schematic diagram of the substrate structure in an exemplary example of the present disclosure.

As shown in FIGS. 2 and 3, at Step S100, the quantum dot material layer 200 is formed on one side of the substrate 100.

In some embodiments of the present disclosure, the substrate 100 includes a base substrate 101 and a pixel definition layer 120. The pixel definition layer 120 is disposed on the one side of the base substrate 101. The pixel definition layer 120 has a plurality of openings. At least part of the quantum dot material layer 200 is formed within the openings.

Furthermore, in the direction perpendicular to the base substrate 101, the pixel definition layer 120 has a height of no more than 1.5 μm.

In the present disclosure, the quantum dot material in the quantum dot material layer 200 may be a material having photosensitive crosslinking properties, or it may be a material not having photosensitive crosslinking properties. In different examples, the quantum dot material may be different. It should be noted that quantum dot materials with photosensitive crosslinking properties refer to those that can crosslink under light conditions (exposure) to form a network structure or generate products insoluble in the developer.

In the present disclosure, the quantum dot material in the quantum dot material layer 200 may include a quantum dot body and at least one quantum dot ligand, and the quantum dot ligand may be connected to the surface of the quantum dot body via a coordination bond.

In some examples, at least one of a plurality of quantum dot ligands includes an alkane chain in its molecular structure.

Quantum dots (QDs) are inorganic semiconductor nanoparticles with sizes of 1-10 nm synthesized by solution method, which is about or less than the exciton Bohr radius of the particle. Due to their small size and large specific surface area, quantum dots are prone to agglomeration, and their surface defects are numerous. Therefore, when applied, the surface of quantum dots is usually coated with organic surface ligands, which not only protect them but also provide good solubility in solution. The migration of carriers (electrons and holes) in quantum dots is limited to the interior of the dots, which makes them with unique optical and electrical properties. Due to its unique size dependent properties, the light absorption performance and the luminescence performance of quantum dots can be easily adjusted by controlling particle size, shape, or surface structure.

The quantum dot body in the disclosure refers to the quantum dots said above, which can be semiconductor nanocrystals and can have various shapes such as spherical, conical, multi armed, and/or cubic nanoparticles, nanotubes, nanowires, nanofibers, nanoplate particles, quantum rods, or quantum sheets. Here, a quantum rod can be a quantum dot body with an aspect ratio (length-diameter ratio) (length to width ratio) greater than or equal to about 1, for example greater than or equal to about 2, greater than or equal to about 3, or greater than or equal to about 5. For example, quantum rods can have an aspect ratio of less than or equal to about 50, less than or equal to about 30, or less than or equal to about 20.

The quantum dot body may have, for example, particle diameter from about 1 nm to about 100 nm, from about 1 nm to about 80 nm, from about 1 nm to about 50 nm, or from about 1 nm to 20 nm (for non-spherical shapes, the average maximum particle length).

The energy band gap of the quantum dot body can be controlled based on its size and composition, and therefore the emission wavelength can be controlled. For example, when the size of the quantum dot body increases, the quantum dot body can have a narrow band gap and therefore be configured to emit light in a relatively long wavelength region, while when the size of the quantum dot body decreases, the quantum dot body can have a wide band gap and therefore be configured to emit light in a relatively short wavelength region. For example, the quantum dot body can be configured to emit light in a predetermined wavelength region of the visible light region based on its size and/or composition. For example, the quantum dot body can be configured to emit a second color light, a third color light, or a first color light, and the second color light can have a peak emission wavelength from about 430 nm to about 480 nm, for example (λ maximum), the third color light may have a peak emission wavelength, such as within the range of about 600 nm to about 650 nm (λ maximum), and the first color light may have a peak emission wavelength from about 520 nm to about 560 nm, for example (λ maximum), but not limited to thereto.

For example, the average particle size of the quantum dot body configured to emit the second color light can be, for example, less than or equal to about 4.5 nm, and less than or equal to about 4.3 nm, less than or equal to about 4.2 nm, less than or equal to about 4.1 nm, or less than or equal to about 4.0 nm. Within the range, for example, the average particle size of the quantum dot body can be from about 2.0 nm to about 4.5 nm, such as from about 2.0 nm to about 4.3 nm, from about 2.0 nm to about 4.2 nm, from about 2.0 nm to about 4.1 nm, or from about 2.0 nm to about 4.0 nm.

The quantum dot body may have a quantum yield of, for example, greater than or equal to about 10%, greater than or equal to about 20%, greater than or equal to about 30%, greater than or equal to about 50%, greater than or equal to about 60%, greater than or equal to about 70%, or greater than or equal to about 90%.

The quantum dot body can have a relatively narrow half width (FWHM). Here, FWHM is the width of the wavelength corresponding to half of the peak absorption point, and when FWHM is narrower, it can be configured to emit light in a narrower wavelength region and achieve higher color purity. The quantum dot body may have FWHM of, for example, less than or equal to about 50 nm, less than or equal to about 49 nm, less than or equal to about 48 nm, less than or equal to about 47 nm, less than or equal to about 46 nm, less than or equal to about 45 nm, less than or equal to about 44 nm, less than or equal to about 43 nm, less than or equal to about 42 nm, less than or equal to about 41 nm, less than or equal to about 40 nm, less than or equal to about 39 nm, less than or equal to about 38 nm, less than or equal to about 37 nm, less than or equal to about 36 nm, less than or equal to about 35 nm, less than or equal to about 34 nm, less than or equal to about 33 nm, less than or equal to about 32 nm, less than or equal to about 31 nm, less than or equal to about 30 nm, less than or equal to about 29 nm, or less than or equal to about 28 nm. Within the range, it can have FWHM of, for example, about 2 nm to about 49 nm, about 2 nm to about 48 nm, about 2 nm to about 47 nm, about 2 nm to about 46 nm, about 2 nm to about 45 nm, about 2 nm to about 44 nm, about 2 nm to about 43 nm, about 2 nm to about 42 nm, about 2 nm to about 41 nm, about 2 nm to about 40 nm, about 2 nm to about 39 nm, about 2 nm to about 38 nm, about 2 nm to about 37 nm, about 2 nm to about 36 nm, about 2 nm to about 35 nm, about 2 nm to about 34 nm, about 2 nm to about 33 nm, about 2 nm to about 2 nm to about 32 nm, about 2 nm to about 31 nm, about 2 nm to about 30 nm, about 2 nm to about 29 nm, or about 2 nm to about 28 nm.

For example, the quantum dot body can include a group II-VI semiconductor compound, a group III-V semiconductor compound, a group IV-VI semiconductor compound, a group IV semiconductor compound, a group I-III-VI semiconductor compound, a group I-II-IV-VI semiconductor compound, a group II-III-V semiconductor compound, or a combination thereof. The group II-VI semiconductor compound may be selected from, for example, a binary compound such as CdSe, CdTe, ZnS, ZnSe, ZnTe, ZnO, HgS, HgSe, HgTe, MgSe, MgS, or a combination thereof, a ternary compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a combination thereof, and a quaternary compound such as HgZnTeS, CdZnSeS, CdZnSeTe, CdZnSTe, CdHgSeS, CdHgSeTe, CdHgSTe, HgZnSeS, HgZnSeTe, HgZnSTe, or a combination thereof, but not limited to thereto. The group III-V semiconductor compound can be selected from, for example, a binary compound such as GaN, GaP, GaAs, GaSb, AlN, AlP, AlAs, AlSb, InN, InP, InAs, InSb, or a combination thereof, a ternary compound such as GaNP, GaNAs, GaNSb, GaPAs, GaPSb, AlNP, AlNAs, AlNSb, AlPAs, AlPSb, InNP, InNAs, InNSb, InPAs, InPSb, or a combination thereof, and a quaternary compound such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof, but not limited to thereto. The group IV-VI semiconductor compound may be selected from, for example, a binary compound such as SnS, SnSe, SnTe, PbS, PbSe, PbTe, or a combination thereof, a ternary compound such as SnSeS, SnSeTe, SnSTe, PbSeS, PbSeTe, PbSTe, SnPbS, SnPbSe, SnPbTe, or a combination thereof, and a quaternary compound such as SnPbSSe, SnPbSeTe, SnPbSTe, or a combination thereof, but not limited to thereto. The group IV semiconductor compound can be selected from, for example, an simple (unary) semiconductor such as Si, Ge, or a combination thereof, and a binary semiconductor compound such as SiC, SiGe, and a combination thereof, but not limited to thereto. The group I-III-VI semiconductor compound can be, for example, CuInSe2, CuInS2, CuInGaSe, CuInGaS, or a combination thereof, but are not limited to thereto. The group I-II-IV-VI semiconductor compound can be, but are not limited to, CuZnSnSe, CuZnSnS, or a combination thereof. The group II-III-V semiconductor compound may include, but are not limited to, InZnP.

The quantum dot body can have substantially uniform concentration or locally different concentration distribution, including the simple semiconductor, the binary semiconductor compound, the ternary semiconductor compound, or the quaternary semiconductor compound.

For example, the quantum dot body can include a cadmium-free (Cd) quantum dot body. The cadmium-free quantum dot body is a quantum dot body that does not include cadmium (Cd). Cadmium (Cd) can cause serious environmental/health problems and is a restricted element under the Restriction of Hazardous Substances (RoHS) in multiple countries, and therefore the cadmium-free based quantum dot body can be effectively used.

As an example, the quantum dot body can be a semiconductor compound including at least one of zinc (Zn), tellurium (Te), and selenium (Se). For example, the quantum dot body can be a Zn—Te semiconductor compound, a Zn—Se semiconductor compound, and/or a Zn—Te—Se semiconductor compound. For example, the amount of tellurium (Te) in the Zn—Te—Se semiconductor compound can be less than the amount of selenium (Se). The semiconductor compound can have a peak emission wavelength (maximum λ) in a wave band of less than or equal to about 480 nm, such as about 430 nm to about 480 nm, and can be configured to emit the second color light.

For example, the quantum dot body can be a semiconductor compound including at least one of indium (In), zinc (Zn), and phosphorus (P). For example, the quantum dot body can be In—P semiconductor compound and/or In—Zn—P semiconductor compound, such as In—Zn—P semiconductor.

The molar ratio of zinc (Zn) to indium (In) in the compound can be greater than or equal to about 25. The semiconductor compound can have a peak emission wavelength (maximum λ) in a wave band of less than about 700 nm, such as about 600 nm to about 650 nm, and can be configured to emit the third color light.

The quantum dot body can have a core-shell structure, where one quantum dot body surrounds another quantum dot body. For example, the core and shell of the quantum dot body may have an interface, and at least one element of the core or shell in the interface may have a concentration gradient, with the concentration of the shell element decreasing towards the core. For example, the material composition of the shell of the quantum dot body has a higher energy band gap than the material composition of the core of the quantum dot body, and thus the quantum dot body can exhibit a quantum confinement effect.

The quantum dot body can have a quantum dot core and a multi-layer quantum dot shell surrounding the core. Here, the multi-layer shell has at least two shell layers, each of which can be a single composition, alloy, and/or a shell layer with a concentration gradient.

For example, the shell far from the core of a multi-layer shell can have a higher energy band gap than the shell near the core, and thus the quantum dot can exhibit a quantum confinement effect.

For example, a quantum dot body with a core-shell structure may include, for example, a core, including a first semiconductor compound including at least one of zinc (Zn), tellurium (Te) and selenium (Se); and a shell disposed on at least a portion of the core and including a second semiconductor compound with a composition different from that of the core.

For example, the first semiconductor compound can be Zn—Te—Se based semiconductor compound that includes zinc (Zn), tellurium (Te), and selenium (Se), for example, Zn—Se based semiconductor compound that includes a small amount of tellurium (Te), for example, a semiconductor compound represented by ZnTexSe1-x, where x is greater than about 0 and less than or equal to 0.05.

For example, in the first semiconductor compound based on Zn—Te—Se, the molar amount of zinc (Zn) can be higher than that of selenium (Se), and the molar amount of selenium (Se) can be higher than that of tellurium (Te). For example, in the first semiconductor compound, the molar ratio of tellurium (Te) to selenium (Se) can be less than or equal to about 0.05, less than or equal to about 0.049, less than or equal to about 0.048, less than or equal to about 0.047, less than or equal to about 0.045, less than or equal to about 0.044, less than or equal to about 0.043, less than or equal to about 0.042, less than or equal to about 0.041, less than or equal to about 0.039, less than or equal to about 0.035 Less than or equal to about 0.03, less than or equal to about 0.029, less than or equal to about 0.025, less than or equal to about 0.024, less than or equal to about 0.023, less than or equal to about 0.022, less than or equal to about 0.021, less than or equal to about 0.02, less than or equal to about 0.019, less than or equal to about 0.018, less than or equal to about 0.017, less than or equal to about 0.016, less than or equal to about 0.015, less than or equal to about 0.014, less than or equal to about 0.013 Less than or equal to about 0.012, less than or equal to about 0.011, or less than or equal to about 0.01. For example, in the first semiconductor compound, the molar ratio of tellurium (Te) to zinc (Zn) can be less than or equal to about 0.02, less than or equal to about 0.019, less than or equal to about 0.018, less than or equal to about 0.017, less than or equal to about 0.016, less than or equal to about 0.015, less than or equal to about 0.014, less than or equal to about 0.013, less than or equal to about 0.012, less than or equal to about 0.011, or less than or equal to about 0.010.

The second semiconductor compound may include, for example, a group II-VI semiconductor compound, a group III-V semiconductor compound, a group IV-VI semiconductor compound, a group IV semiconductor compound, a group I-III-VI semiconductor compound, a group I-II-IV-VI semiconductor compound, a group II-III-V semiconductor compound, or a combination thereof. The examples of the group II-VI semiconductor compound, the group III-V semiconductor compound, the group IV-VI semiconductor compound, the group IV semiconductor compound, the group I-III-VI semiconductor compound, the group I-II-IV-VI semiconductor compound, and the group II-III-V semiconductor compound are the same as described above.

For example, the second semiconductor compound may include zinc (Zn), selenium (Se), and/or sulfur (S). For example, the shell may include ZnSeS, ZnSe, ZnS, or a combination thereof. For example, the shell may include at least one inner shell near the core and the outermost shell at the outermost side of the quantum dot body. The inner shell may include ZnSeS, ZnSe, or a combination thereof, and the outermost shell may include ZnS. For example, the shell can have a concentration gradient of a component, and for exmple the amount of sulfur (S) can increase as far from the core.

For example, the quantum dot body with a core-shell structure may include: a core, including a third semiconductor compound including indium (In), as well as at least one of zinc (Zn) and phosphorus (P); and a shell disposed on at least a portion of the core and including a fourth semiconductor compound with a composition different from that of the core.

In the third semiconductor compound based on In—Zn—P, the molar ratio of zinc (Zn) to indium (In) can be greater than or equal to about 25. For example, in the third semiconductor compound based on In—Zn—P, the molar ratio of zinc (Zn) to indium (In) can be greater than or equal to about 28, greater than or equal to about 29, or greater than or equal to about 30. For example, in the third semiconductor compound based on In—Zn—P, the molar ratio of zinc (Zn) to indium (In) can be less than or equal to about 55, such as less than or equal to about 50, less than or equal to about 45, less than or equal to about 40, less than or equal to about 35, less than or equal to about 34, less than or equal to about 33, or less than or equal to about 32.

The fourth semiconductor compound may include, for example, a group II-VI semiconductor compound, a group III-V semiconductor compound, a group IV-VI semiconductor compound, a group IV semiconductor compound, a group I-III-VI semiconductor compound, a group I-II-IV-VI semiconductor compound, a group II-III-V semiconductor compound, or a combination thereof. The examples of the group II-VI semiconductor compound, the group III-V semiconductor compound, the group IV-VI semiconductor compound, the group IV semiconductor compound, the group I-III-VI semiconductor compound, the group I-II-IV-VI semiconductor compound, and the group II-III-V semiconductor compound are the same as described above.

For example, the fourth semiconductor compound may include zinc (Zn) and sulfur (S), as well as optionally selenium (Se). For example, the shell may include ZnSeS, ZnSe, ZnS, or a combination thereof. For example, the shell may include at least one inner shell near the core and the outermost shell at the outermost side of the quantum dot body. At least one of the inner shell and the outermost shell can include the fourth semiconductor compound ZnS, ZnSe, or ZnSeS.

In some examples, the quantum dot material is a quantum dot material without photosensitive crosslinking properties. Wherein the quantum dot ligand may be, but is not limited to, oleic acid, stearic acid, oleylamine, long chain alkylamine, long chain alkylphosphine, long chain alkylphosphonic acid, and the like.

In other examples, the quantum dot material is a quantum dot material with photosensitive crosslinking properties. Wherein the quantum dot ligand may be an organic ligand with a photosensitive group.

For example, in an example, the structural formula of the quantum dot ligand includes a first photosensitive group at the terminal of the molecular structure of the quantum dot ligand.

In such examples, the quantum dot material further includes a second photosensitive crosslinking agent, which can induce a crosslinking reaction of first photosensitive groups. When the first photosensitive group is selected from a structure including a carbon-carbon double bond, the photosensitive crosslinking agent is selected from a photosensitive radical initiator, and the photosensitive radical initiator is selected from benzoin and its derivatives, acetophenone derivatives or aromatic ketone derivatives. The first photosensitive group can be a structure containing a carbon-carbon double bond, or a saturated 3 to 5-membered heterocyclic structure containing O or S. Under light conditions, the second photosensitive crosslinking agent generates radicals to crosslinking of the carbon-carbon double bond in photosensitive groups. When the first photosensitive group is selected from a structure containing a saturated 3 to 5-membered heterocyclic group containing O or S, the second photosensitive crosslinking agent is selected from the group of photo-acid generators, which are selected from the group of sulfates, triazines, sulfonates or diazonates. Photo-acid generators generate hydrogen ions to catalyze a ring-opening of saturated 3 to 5-membered rings containing O or S, leading to crosslinking reactions.

Furthermore, the quantum dot body includes a first quantum dot body and a second quantum dot body, and the quantum dot ligand may be connected to the first quantum dot body or/and the second quantum dot body by a coordination bond. When the quantum dot ligand includes a first photosensitive group, the first quantum dot body and the second quantum dot body are crosslinked to form a network structure by the first photosensitive group in the quantum dot ligand under light conditions.

In other examples, the material of the quantum dot material layer includes a first quantum dot body, a second quantum dot body, a quantum dot ligand, and a photosensitive initiator, and the quantum dot ligand may have a plurality of types. For example, the quantum dot ligand includes a first quantum dot ligand and a second quantum dot ligand, and the first quantum dot ligand and the second quantum dot ligand have different structures. The first quantum dot ligand includes a cross-linkable group at the terminal of the molecular structure thereof, and the second quantum dot ligand includes a second photosensitive group with a structured of—A-B, wherein A is an iminium group, and B is a protective group. Under light conditions, the second photosensitive group can remove the protective group and form an amino group in the presence of a photosensitive initiator; the cross-linkable group can form crosslinking and salts insoluble in the developer with the amino group formed by the removal of the protective group from the second photosensitive group, or the cross-linkable group can form crosslinking and salts insoluble in the developer with the amino group formed by the removal of the protective group from the second photosensitive group after activation by an activator. The cross-linkable groups are selected from epoxy groups, carboxylic acid groups or sulfonic acid groups.

The protective group is selected from the group consisting of the following structures:

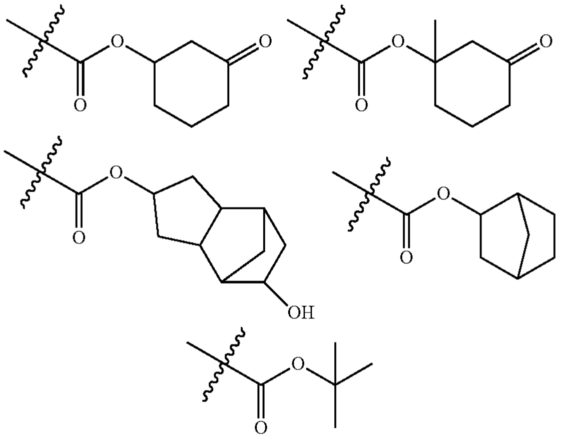

represents a chemical bond.

In yet other examples, the material of the quantum dot material layer includes a quantum dot body and a quantum dot ligand, and the quantum dot ligand is connected to the quantum dot body by a coordination group. The quantum dot ligand includes a structure of —Y—Z, wherein Z is a solubility group, and the solubility group is selected from a polar group; Y includes an interconnected connecting group and a third photosensitive group, and the connecting group is connected to the ligand and the third photosensitive group. The connecting group is selected from an alkylidene. The third photosensitive group is capable of breaking a bond under light conditions to decompose the interconnected quantum dot body and quantum dot ligand into a first material containing the quantum dot body, the quantum dot ligand, and connecting group, and a second material. The second material can be dissolved in the developer and the first material is insoluble in the developer.

Under light conditions, the third photosensitive group undergoes bond breaking, and its terminal forms an amino, hydroxyl, or carboxyl group.

In such examples, the third photosensitive group is selected from a group including the structure of

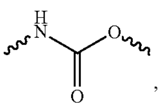 , 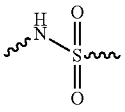 , 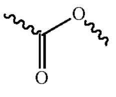 or

.

The solubility group is selected from quaternary ammonium groups.

In yet other examples of the present disclosure, the material of the quantum dot material layer includes a first quantum dot body, a second quantum dot body, a quantum dot ligand, and a third photosensitive crosslinking agent. The quantum dot ligand is connected to the first quantum dot body or/and the second quantum dot body by a coordination bond, and the quantum dot ligand includes an alkane chain.

The third photosensitive crosslinking agent includes at least two fourth photosensitive groups at the terminals of the molecular structure thereof. Under light conditions, the fourth photosensitive group can undergo a hydrocarbon insertion reaction with the alkane chain of the quantum dot ligand to form a network structure.

The fourth photosensitive group is selected from a structure containing a benzophenone group, an azide group, a diazo group, or a diazirine group.

In some examples of the present disclosure, Step S100 includes:

Step S110, dissolving the quantum dot body and the quantum dot ligand in a quantum dot solvent, or dissolving the quantum dot body, the quantum dot ligand and a photosensitive crosslinking agent in a quantum dot solvent, to form a quantum dot material mixture;

Step S120, forming the quantum dot material layer 200 by depositing the quantum dot material mixture on one side of the substrate 100.

In the present disclosure, the quantum dot solvent can be selected based on the type of the quantum dot body or the like. For example, hexane/cyclohexane, heptane, octane, toluene, xylene, and the like, can be used to dissolve the oil-soluble quantum dot body; propylene glycol methyl ether acetate, ethanol, isopropanol, and the like, can be used to dissolve the amphiphilic (both hydrophilic and lipophilic) or alcohol-soluble quantum dot body; deionized water, can be used to dissolve the water-soluble quantum dot body.

As shown in FIG. 4, Step S200, forming the organic material layer 300 on a side of the quantum dot material layer 200 away from the substrate 100.

The organic material layer 300 may be used to block water and oxygen. When the quantum dot material layer 200 is covered with the organic material layer 300, it can avoid exposing the quantum dot material to the atmosphere and slow down its PLQY decrease.

Furthermore, the organic material layer 300 has the following properties of:

(1) effectively protecting the quantum dot material layer 200 and slowing down its PLQY decrease;

(2) being capable of removing the organic material layer 300 by a very gentle method in a subsequent process or minimizing the residual amount after removal not to affect the luminescence performance of the quantum dot film layer;

(3) a very good transmittance, the transmittance of more than or equal to 80% in the ultraviolet and visible wave bands, and not emitting light in the visible wave bands to be convenient for subsequent exposure without requiring significant changes in exposure amount and not to affect the output and emission spectra of quantum dot light emitting devices using it.

In some examples of the present disclosure, the material of the organic material layer 300 includes a hydrocarbon mixture with 18-30 carbon atoms.

In some examples of the present disclosure, the mixture of hydrocarbon mixture includes straight chain alkanes and branched chain alkanes, and may also include one or more of cycloalkanes, olefins, and alkynes. Wherein, the cycloalkanes may be monocyclic cycloalkanes with side chains.

In some examples, by weight percentage, the hydrocarbon mixture includes 80%-100% straight chain alkanes, 0%-20% other hydrocarbons, and other hydrocarbons includes any one or a combination of branched alkanes, cycloalkanes, olefins, and alkynes. Specifically, in the hydrocarbon mixture, the proportion of straight chain alkanes can be 80%, 81%, 82%, 83%, 84%, 85%, 86%, 87%, 88%, 89%, 90%, 91%, 92%, 93%, 94%, 95%, 96%, 97%, 98%, 99%, and 100%. The proportion of other hydrocarbons can be 20%, 19%, 18%, 17%, 16%, 15%, 14%, 13%, 12%, 11%, 10%, 9%, 8%, 7%, 6%, 5%, 4% 3%, 2%, 1%, and 0%.

For example, in some examples, the hydrocarbon mixture includes 80%-95% straight chain alkanes and 5%-20% other hydrocarbons by weight percentage.

Furthermore, in some examples, at least one of the multiple quantum dot ligands contained in the quantum dot material layer contains an alkane chain in the molecular structure of the quantum dot ligand. In this way, the chemical composition of the surface of the quantum dot body is similar to the main composition of the organic material layer, which helps to increase the wettability of the organic material layer, and provides a foundation for improving the uniformity of the organic material layer on the surface of the quantum dot material layer. Wherein the length or number of alkane chains contained in the quantum dot body may be adjusted according to the proportion or content of the hydrocarbon mixture contained in the organic material layer, and specific limitations are not made in this disclosure.

In some examples of the present disclosure, the material of the organic material layer has an initial melting temperature of no more than 60° C. in order to avoid excessive melting temperature affecting the luminescence performance of the quantum dot material layer 200.

In some examples of the present disclosure, the hydrocarbon mixture may be waxes, that is, the material of the organic material layer 300 includes waxes. The melting temperature of the wax itself is below 60° C. Specifically, different types of waxes are classified into different grades, such as 52, 54, 56, 58, etc., based on their melting point, usually at intervals of 2° C.

Preferably, the wax is selected as a slice wax of 52-54° C. The main reason for using the wax in this melting temperature range is that its solubility in solvents such as toluene at room temperature is higher, the solution will not precipitate at a high concentration of 100-200 g/mL at room temperature, and the solution can remain stable and easy to store. However, the wax of 60-62° C., at a concentration of 100 g/mL, the temperature drop to room temperature, the solution becomes muddy, which is not conducive to experimentation and storage.

Figure 30:
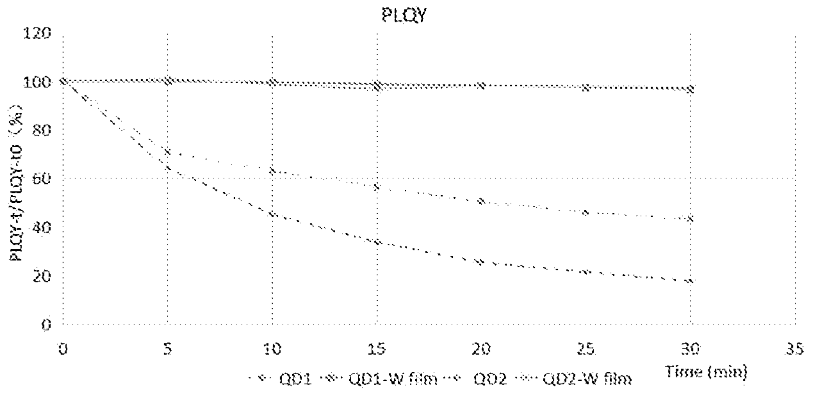
FIG. 30 is a schematic diagram of PLQY variations during exposure of the organic material layer formed on the quantum dot material layer in an exemplary example of the present disclosure.

In order to further demonstrate the protective effect of the organic material layer 300 (including waxes) on the quantum dot material layer 200 of the present disclosure, an organic material layer was coated on the quantum dot film in the present disclosure. As shown in FIG. 30, after coating the organic material layer, the quantum dot film was able to maintain a stable PLQY in the atmosphere, and the PLQY was maintained at more than 96% of the PLQY at the time of 0 during the 30-minute measurement window, which was able to effectively protect the quantum dot film to maintain a stable PLQY in the atmosphere. In the figure, W film represents the organic material layer.

Figure 31:
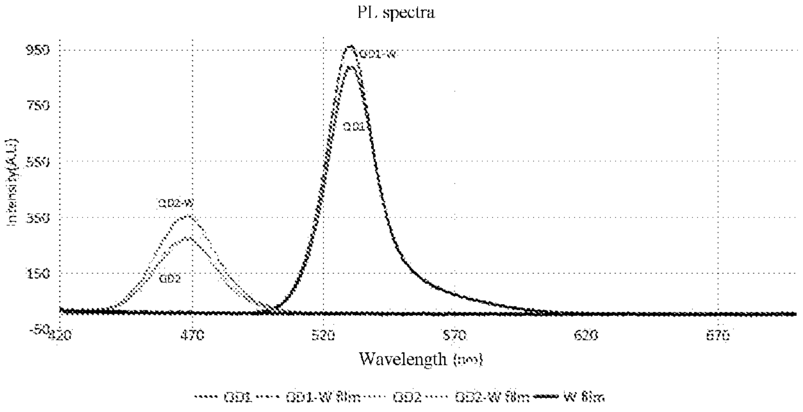
FIG. 31 is a spectrogram of the organic material layer formed on the quantum dot material layer in an exemplary example of the present disclosure.

In addition, the disclosure also tested the spectral data of the organic material layer 300. As shown in FIG. 31, the experimental results show that the organic material layer 300 itself does not emit light, and the PL spectra of the quantum dot film coated with the organic material layer 300 and the original quantum dot film have no variation on the peak positions and peak shapes, indicating that the organic material layer 300 itself does not affect the position of the center wavelength of the light emitting spectrum of the quantum dot film, and does not affect the color purity of the device using it.

Figure 32:
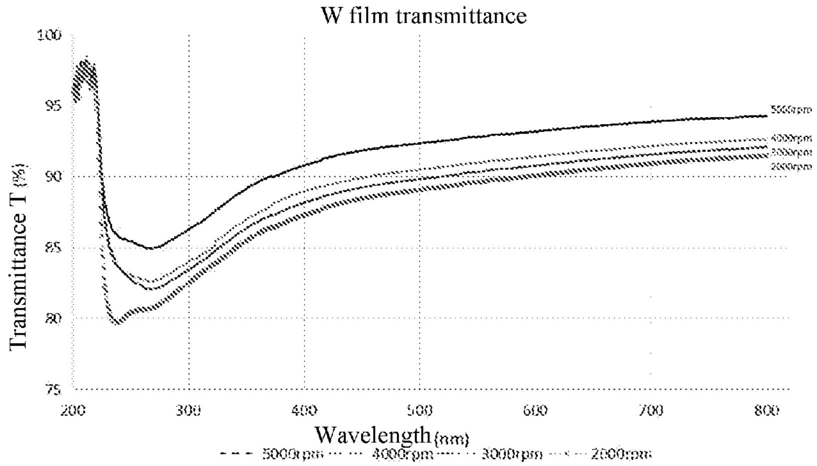
FIG. 32 is a graph of the variation on transmittance of the organic material layer in an exemplary example of the present disclosure.

Furthermore, the present disclosure tests the transmittance of the organic material layer 300. As shown in FIG. 32, the UV-VIS transmittance data of spin-coated organic material layer 300 at different rotational speeds shows the magnitude of full-spectrum transmittance of the organic material layer films of different thicknesses (2000 rpm/3000 rpm/4000 rpm/5000 rpm) according to the experimental results. It can be seen that the transmittance is above 87% in the visible region and above 80% in the UV region.

In some examples of the present disclosure, the material of the organic material layer 300 further includes a first photosensitive crosslinking agent.

The structural formula of the first photosensitive cross-linking agent in the organic material layer 300 contains a fifth photosensitive group at the terminal of the structural formula of the first photosensitive crosslinking agent, and the fifth photosensitive group may be selected from a group containing a benzo ketone structure, an azide structure, or a diazo structure.

The number of fifth photosensitive groups contained in the first photosensitive crosslinking agent may be a plurality, such as not less than two. Specifically, it may be two, three, four or more. For example, in an example, the photosensitive crosslinking agent has m terminals and n terminals are fifth photosensitive groups, wherein n≤m, m≥2. When the first photosensitive crosslinking agent includes more than one fifth photosensitive group, each fifth photosensitive group may be the same or different.

Specifically, the fifth photosensitive group of the first photosensitive crosslinking agent in the organic material layer 300 may be selected from the group consisting of the following structures:

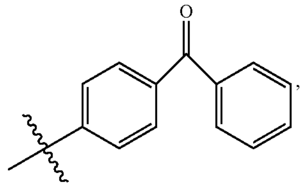
,
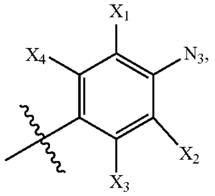

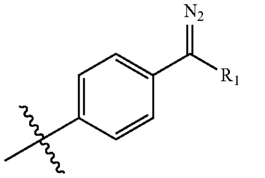
and
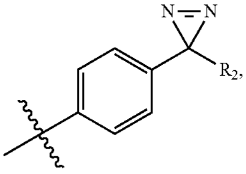

wherein,

“ 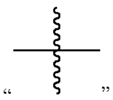 ”

is a chemical bond, and can be used to connect to other structures in the structural formula of the first photosensitive crosslinking agent.

$X_1$, $X_2$, $X_3$, $X_4$ are each independently selected from halogen atoms; specifically, the halogen atoms include fluorine, chlorine, bromine, and iodin; preferably, $X_1$, $X_2$, $X_3$, $X_4$ are each independently selected from fluorine;

$R_1$, $R_2$ represents the remaining molecular chain in the photosensitive group, without any special limitations.

It should be noted that the photosensitive crosslinking agent contained in the organic material layer 300 may be the same or different from the photosensitive crosslinking agent contained in the quantum dot material layer 200. Preferably, the photosensitive crosslinking agent in the organic material layer 300 and the photosensitive crosslinking agent in the quantum dot material layer 200 are different and can be dissolved in different solvents.

In some examples of the present disclosure, Step S200 includes:

(1) dissolving a hydrocarbon mixture in a protective material solvent, or dissolving a hydrocarbon mixture and a photosensitive crosslinking agent in a protective material solvent, to form a protective material mixture;

(2) forming an organic material layer 300 by depositing the protective material mixture on the side of the quantum dot material layer 200 away from the substrate 100.

The protective material solvent can be a non-polar or weakly polar solvent, such as hexane, heptane, octane, gasoline, petroleum ether, ether, carbon disulfide, benzene, toluene, xylene, trichloromethane, carbon tetrachloride and the like.

In some examples of the present disclosure, the quantum dot material solvent in Step S100 and the protective material in Step S200 may be the same or different. Preferably, the quantum dot solvent and the protective material solvent are different. Further, the quantum dot solvent and the protective material solvent are different solvents in order to avoid influencing the already formed quantum dot material layer 200 during the formation of the organic material layer 300. The protective material solvent can be an orthogonal solvent, that is, in the protective material solvent system, the previous quantum dot body and the like, has a lower solubility in the solvent, so that the formed quantum dot material layer 200 can be protected.

For example, if the hydrocarbon mixture in the organic material layer 300 is dissolved in a solvent such as hexane, heptane, octane, gasoline, petroleum ether, ethyl ether, carbon disulfide, benzene, toluene, xylene, trichloromethane, carbon tetrachloride and the like, the quantum dot solvent can be selected from a solvent such as propylene glycol methyl ether acetate, ethanol, isopropyl alcohol, or deionized water. Accordingly, the quantum dot body is selected from amphiphilic or alcohol-soluble quantum dot bodies or water-soluble quantum dot bodies.

It is to be noted here that in Step S200, the initial thickness of the formed organic material layer 300 may be of 20 nm-80 nm, which may be 20 nm, 30 nm, 40 nm, 50 nm, 60 nm, 70 nm, or 80 nm, but is not limited thereto.

In the present disclosure, both Step S100 and Step S200 are performed in an inert gas (e.g., nitrogen) or vacuum environment.

In related technologies, researchers may use processes such as forming a photoresist layer on the surface of the quantum dot material layer 200 away from the substrate 100, followed by exposure and development.

It should be noted that the organic material layer of the present disclosure is different from the photoresist layer. First, the photoresist layer has a strong absorption in the UV band (300 nm-400 nm) in response to ultraviolet light, and its transmittance in this wave band is not high, and in the visible light region, the transmittance of the photoresist layer is also low because the photoresist layer, which generally appears in a brown or yellow color, has a significant absorption in the visible light region, resulting in a lower transmittance. Therefore, at approximately the same thickness, the light transmittance of the photoresist layer is lower than the light transmittance of the organic material layer in the present disclosure. Secondly, the thickness of the photoresist layer is usually from 1 μm to 3 μm, and the film-forming performance of photoresist with a thickness of one hundred nanometers will gradually deteriorate, leading to a decrease in film uniformity. The material used in the organic material layer of the present disclosure forms a thin film with a thickness of one hundred nanometers (such as 50-300 nm), which is significantly smaller than that of the photoresist layer. In addition, the photoresist currently used in commercial and semiconductor process production usually has a small amount of residual photoresist layer on the surface after coating, exposure, and development of the pattern. For these small amounts of residue, different processes are suitable for different treatment methods, such as stripping or etching/ashing, in order to remove the residual photoresist layer completely. The conditions are relatively harsh. These processes have a very serious impact on the surface of the quantum dot material layer. The stripping solvent used for stripping can cause damage to the quantum dot material layer, while in the etching/ashing process, the plasma used will significantly damage the quantum dot material layer itself, and even lead to quantum dot failure (inability to emit light). Therefore, the commonly used photoresist layers in related technologies cannot be used in the organic material layers of the present disclosure. The organic material layer disclosed herein can be easily removed by temperature and solvent without causing damage to the quantum dot material layer.

As shown in FIG. 5, in Step S300, a preset area of the substrate 100 is exposed to materials of the quantum dot material layer 200 in the preset area crosslink or generate salts insoluble in the developer, or/and to materials of the organic material layer 300 in the preset area crosslink.

In Step S300, exposing a preset area of the substrate 100 is performed in an atmospheric environment. Specifically, the substrate fabricated in Step S200 is removed from the inert gas environment, and the substrate is subsequently aligned with the photomask plate, and a photolithography machine is utilized to expose the upper region to UV light, while the other region (non-preset area) are not exposed to UV light.

In this step, when the quantum dot material layer 200 is a material that does not have photosensitive crosslinking properties, the material of the organic material layer 300 shall include a photosensitive crosslinking agent to cause crosslinking of the organic material layer 300 upon exposure of the preset area. When the quantum dot material layer 200 is a material having photosensitive crosslinking properties, the material of the organic material layer 300 may include or does not include a first photosensitive crosslinking agent.

Specifically, when the quantum dot material layer 200 is a material having photosensitive crosslinking properties, in Step S300, when the preset area is exposed, the material of the quantum dot material layer 200 in the preset area crosslinks or generates salts insoluble in the developer.

For example, the quantum dot ligand of the quantum dot material layer 200 contains the first photosensitive group that is a carbon-carbon double bond, and upon exposure of the preset area, the second photosensitive crosslinking agent induces to a crosslinking of the carbon-carbon double bonds to form a network structure; or the quantum dot ligand of the quantum dot material layer 200 contains the first photosensitive group that is a saturated 3 to 5-membered heterocyclic structure containing O or S, and upon exposure of the preset area, the second photosensitive crosslinking agent induces a crosslinking reaction by a ring-opening of the saturated 3 to 5-membered ring containing O or S to form a network structure; or the quantum dot ligand of the quantum dot material layer 200 includes a first quantum dot ligand and a second quantum dot ligand, and structures of the first quantum dot ligand and the second quantum dot ligand are same or different, wherein the first quantum dot ligand includes a cross-linkable group, and the second quantum dot ligand includes a second photosensitive group with a structured of—A-B, wherein A is an iminium group, and B is a protective group; upon exposure of the preset area, the second photosensitive group removes the protective group and form an amino group in the presence of a photosensitive initiator; the cross-linkable group and the amino group formed by the removal of the protective group from the second photosensitive group form crosslinking or form salts insoluble in the developer, or the cross-linkable group and the amino group formed by the removal of the protective group from the second photosensitive group form crosslinking or form salts insoluble in the developer after activation by an activator;

the quantum dot ligand contains an alkane chain; the third photosensitive crosslinking agent contains at least two fourth photosensitive groups, the fourth photosensitive group is at the terminal of the molecular structure of the third photosensitive crosslinking agent; under light conditions, the fourth photosensitive group can undergo a hydrocarbon insertion reaction with the alkane chain of the quantum dot ligand, causing the quantum dot ligand to react with the third photosensitive crosslinking agent to form a network structure; or the quantum dot ligand includes a structure of —Y—Z, wherein Z is a solubility group, which is selected from a polar group; Y includes an interconnected connecting group and a third photosensitive group, and the connecting group is connected between the coordination group and the third photosensitive group; the connecting group is selected from an alkylene group; the third photosensitive group can undergo bond breaking under light conditions to decompose the interconnected quantum dot body and quantum dot ligand into a first material containing the interconnected quantum dot body, coordination groups, and connecting groups, as well as a second material containing soluble groups; the second material can dissolve in the developer, while the first material is insoluble in the developer.

When the material of the organic material layer 300 includes the first photosensitive crosslinking agent, upon exposure of the preset area, crosslinking of the hydrocarbon mixture in the organic material layer 300 is formed. Taking the first photosensitive crosslinking agent contained in the organic material layer 300 listed above as an example, when the first photosensitive crosslinking agent contains different fifth photosensitive groups, the hydrocarbon mixture may undergo different crosslinking reactions. Specifically, the crosslinking reactions that occur in the carbon hydrogen bonds (C—H) of hydrocarbon mixtures are as follows:

(1)
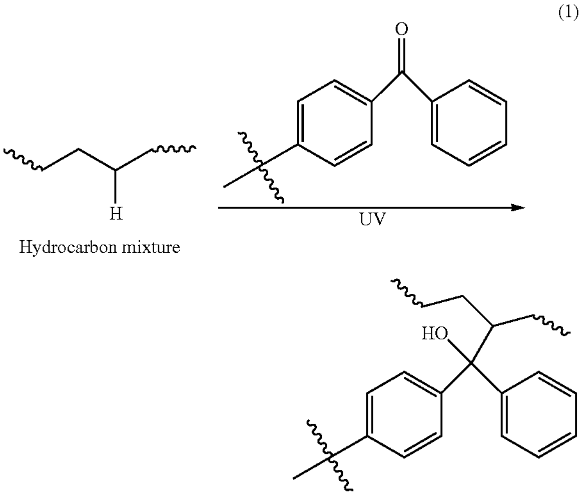
(2)
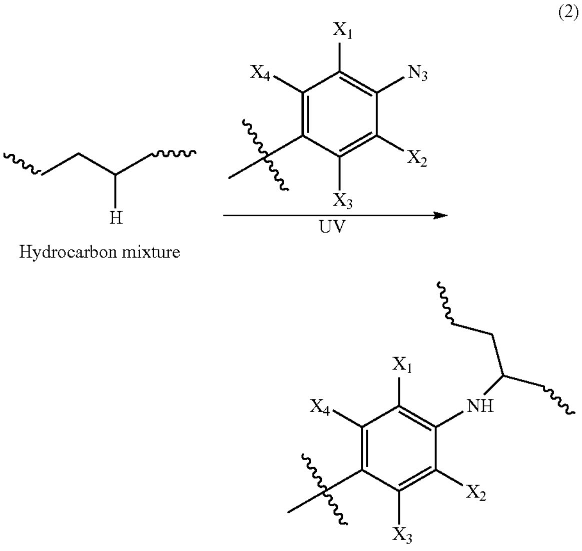
(3)
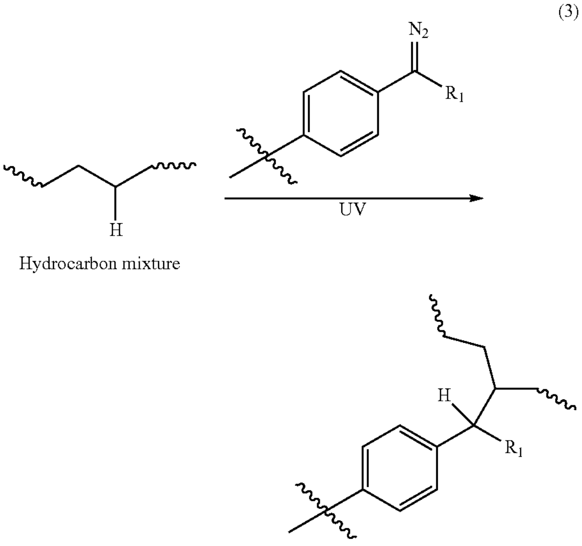
-continued
(4)
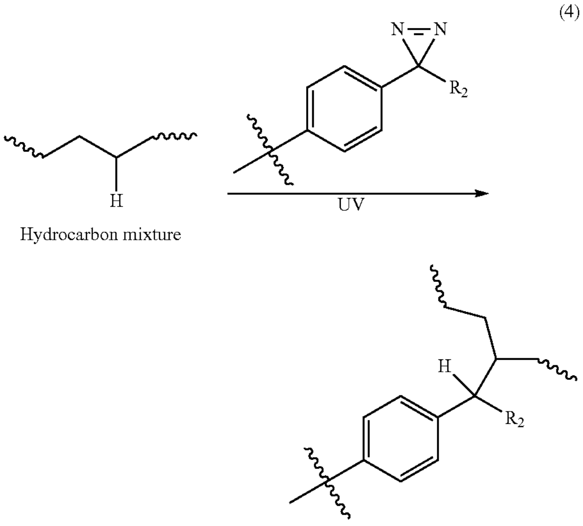
In the present disclosure, "  " represents a hydrocarbon chain, and
represents a chemical bond.
Crosslinking reactions of double bonds (olefins) in hydrocarbon mixtures are as follows:
(1)
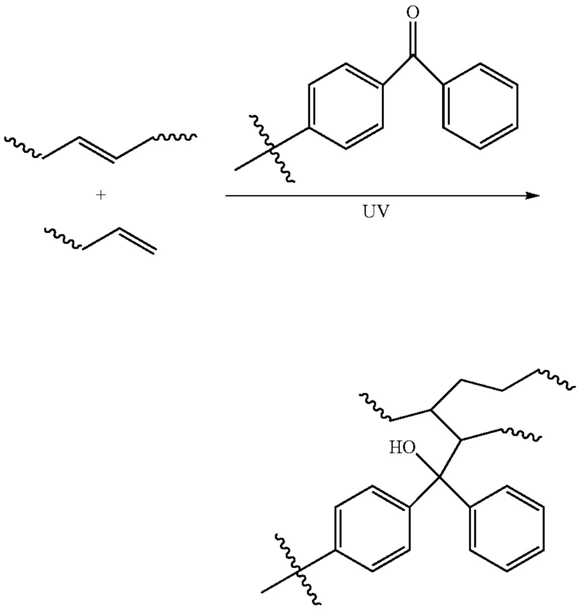

-continued
(2)
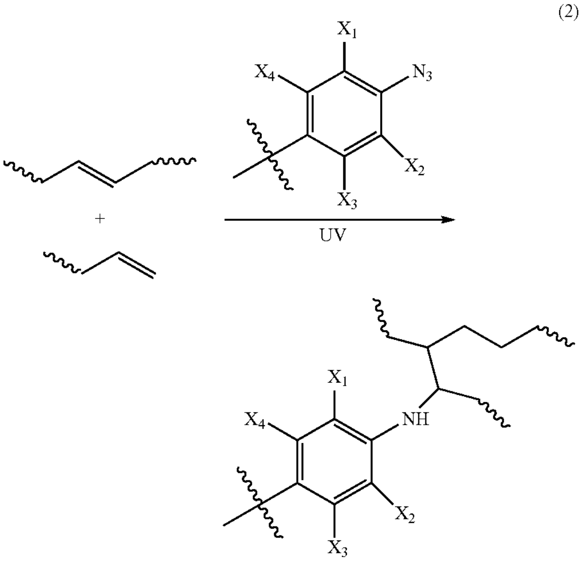
(3)
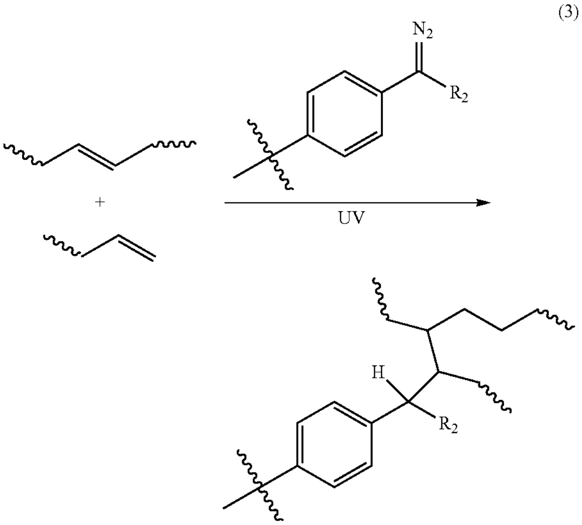
(4)
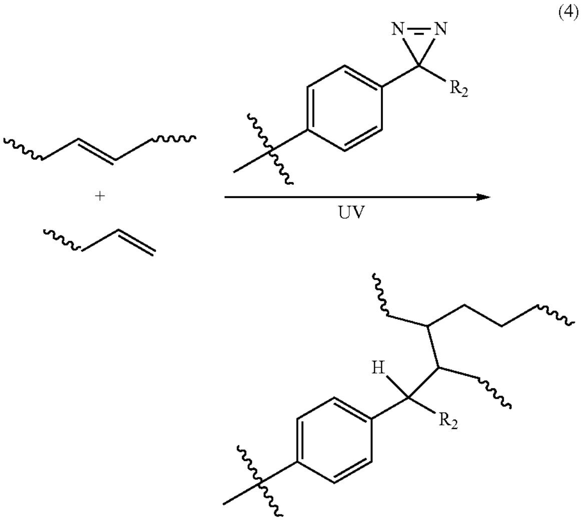
Crosslinking reactions of the triple bond (alkynes) in hydrocarbon mixtures are as follows:
(1)
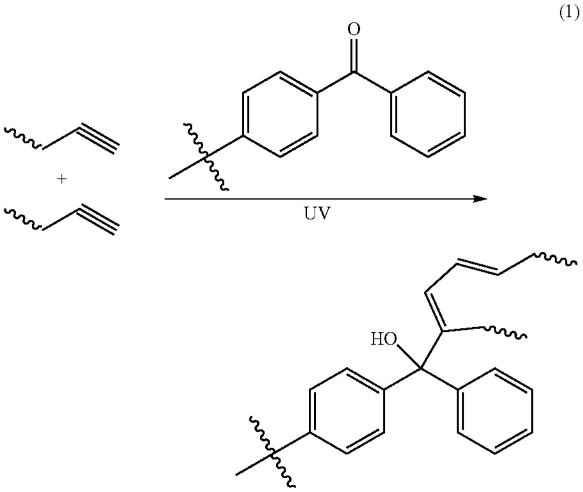
(2)
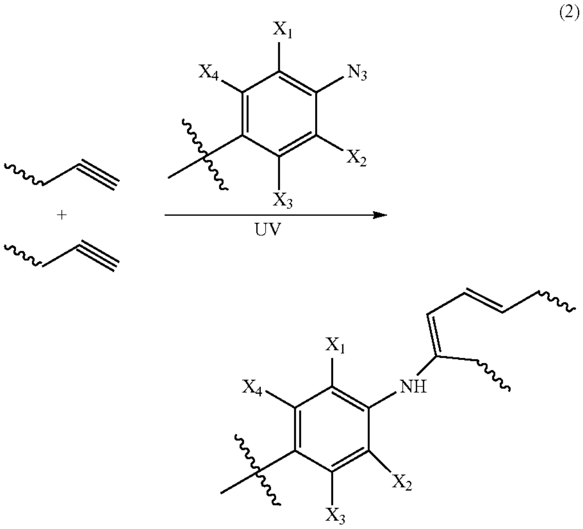
(3)
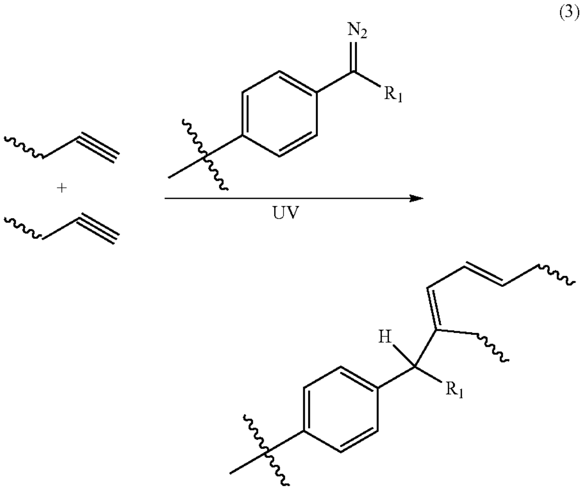

-continued (4)

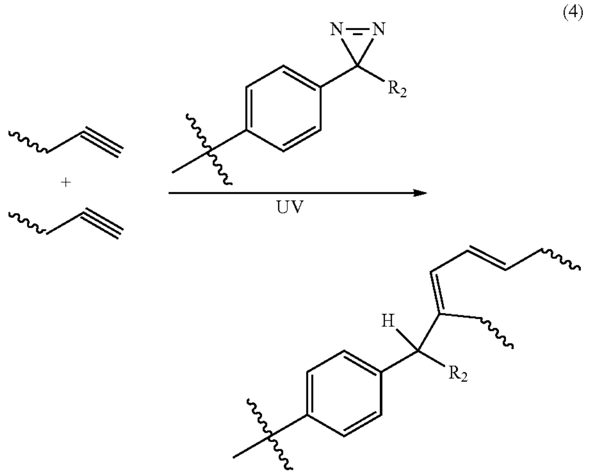

In Step S300, for example, the organic material layer 300 includes the wax, the stability of the organic material layer 300 can be enhanced when the organic material layer 300 is cross-linked. This may be manifested by an increase in the melting temperature of the organic material layer 300 and a decrease in the solubility in the solvent. Further, the extent of crosslinking of the organic material layer 300 can be adjusted by controlling the amount of the first photosensitive crosslinking agent added or the amount of exposure during exposure, thereby adjusting its melting temperature and solubility, etc.

Figure 22:
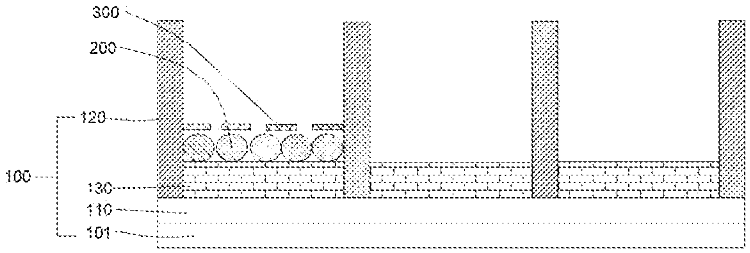
FIG. 22 is a schematic diagram of the structure of removing the organic material layer 300 and the quantum dot material layer 200 from the non-preset area in another exemplary example of the disclosure.

FIG. 6 or FIG. 22 shows Step S400 of removing the organic material layer 300 from a non-preset area of the substrate 100 and quantum dot material layer 200.

In this disclosure, the organic material layer 300 and quantum dot material layer 200 in the non-preset region of the substrate 100 can be removed by various different methods.

Step S400 is described in detail below in connection with different embodiments.

Example 1

As shown in FIG. 6, in this example, Step S400 includes:

Step S410, developing to remove the organic material layer 300 and the quantum dot material layer 200 in a non-preset area.

Wherein the organic material layer 300 in the preset area undergoes crosslinking during exposure.

In this example, the material of the organic material layer 300 includes a photosensitive crosslinking agent, and the material of the quantum dot material layer 200 may be a material with photosensitive crosslinking properties or a material without photosensitive crosslinking properties. During exposure, the organic material layer 300 in the preset area undergoes crosslinking, resulting in an increase in melting temperature and a decrease in solubility. It is unlikely to be removed during development. The organic material layer 300 in a non-preset area has not undergone crosslinking and can be removed during development.

For quantum dot material layer 200, when it is a material with photosensitive crosslinking properties, the quantum dot material layer 200 in the preset area undergoes crosslinking and is substantially not removed during development, while the quantum dot material layer 200 in the non-preset area does not undergo crosslinking and can be removed during development. When the quantum dot material layer 200 is a material that does not have photosensitive crosslinking properties, the quantum dot material layer 200 in the preset area will not be removed during development due to the protection of the organic material layer 300 in that area, while the quantum dot material layer 200 in the non-preset area will be removed during development.

Specifically, Step S410 includes:

Step S410, performing a first development by the first developer to remove the organic material layer 300 in a non-preset area;

Step S420, performing a second development by the second developer to remove the quantum dot material layer in a non-preset area 200.

Wherein the first developer fluid and the second developer are different. Specifically, the second developer has a large relative dielectric constant than the relative dielectric constant of the first developer.

In this example, in order to reduce the process complexity, two development steps are used to separately remove a non-preset area of the organic material layer 300 and the quantum dot material layer 200, wherein the organic material layer 300 includes a hydrocarbon mixture, and the first developer may be a nonpolar or weakly polar solvent having a relative dielectric constant of not more than 3.6.

The relative dielectric constant $\varepsilon_r$ can be measured using an electrostatic field in the following way: first, measuring the capacitance $C_0$ of the capacitor with a vacuum between the plates, and then measuring the capacitance $C_x$ in the same capacitance distance between the plates with a dielectric added between the plates. The relative dielectric constant can be calculated using the following formula:

$$\varepsilon_r = C_x / C_0.$$

At standard atmospheric pressure, the relative capacitance $\varepsilon_r$ of dry air without carbon dioxide is 1.00053. Therefore, the capacitance Cair of this electrode configuration in air is sufficiently accurate to measure the relative capacitance $\varepsilon_r$ instead of $C_0$ (refer to GB/T 1409-2006).

Specifically, substances with relative dielectric constants of from 2.8 to 3.6 are weakly polarized solvents; substances with relative dielectric constants of less than 2.8 are non-polar solvents. Hexane, heptane, octane, gasoline, petroleum ether, ethyl ether, carbon disulfide, benzene, toluene, xylene, trichloromethane, carbon tetrachloride, and other solvents may be used for the first developer.

Furthermore, in this example, the temperature of the first developer is less than 60° C. For example, if the organic material layer 300 contains waxes, the melting temperature of waxes themselves is less than 60° C. Specifically, different types of waxes are classified into different grades, such as 52, 54, 56, 58, etc., based on their melting point, usually at intervals of 2° C. After crosslinking of the organic material layer 300, the melting temperature of waxes is lower than 60° C. In this example, it is preferred that the temperature of the first developer is less than 60° C., in order to avoid impacting the organic material layer 300, which is cross-linked in the preset area, during development.

The relative dielectric constant of the second developer is greater than the relative dielectric constant of the first developer. The second developer may be a solvent such as propylene glycol methyl ether acetate, ethanol, isopropanol, deionized water, or the like. It should be noted that the selection of the second developer is also related to the properties of the quantum dot body or the quantum dot ligand, and the person skilled in the art may select the second developer according to the actual situation.

After Step S400, the patterned quantum dot film layer is obtained.

Example 2

As shown in FIG. 6, in this example, Step S400 includes:

Step S410, heating the non-preset area, and rotating the substrate 100, to melt the organic material layer 300 in the non-preset area and remove the melted organic material layer 300 by centrifugal force;

Step S420, developing to remove the quantum dot material layer 200 in a non-preset area.

wherein the quantum dot material layer 200 disposed in the preset area undergoes crosslinking or generate salts insoluble in the developer during exposure.

In Step S410, in this example, the organic material layer 300 does not undergo a crosslinking reaction during exposure, that is, the material layer 300 does not contain a photosensitive crosslinking agent. In this case, it is not possible to remove the organic material layer 300 by a conventional developing step. Therefore, the present disclosure employs a method of heating a non-preset area so that the organic material layer 300 in the region melts into a low-viscosity liquid, and then removes the liquid organic material layer 300 by centrifugal force through high-speed rotation.

Specifically, the temperature for heating the non-preset area is 70° C.-110° C., such as 70° C., 75° C., 80° C., 85° C., 90° C., 95° C., 100° C., 105° C., or 110° C., and the like. At this temperature, the organic material layer 300 may melt into a low viscosity liquid. If the organic material layer 300 contains the wax, the wax melts at this temperature into a low-viscosity liquid that can be removed by centrifugal force.

Furthermore, the organic material layer 300 can be liquefied into a low viscosity liquid by electrically heating in the non-preset area using the electrodes, or by heating the non-preset area with a laser so that the region are heated to 70° C. or 80° C. or more (typically no more than 110° C. is required).

In this example, the quantum dot material layer 200 is a material having photosensitive crosslinking properties, and the quantum dot material layer 200 in a preset area crosslinks or generates salts insoluble in the developer during exposure, which cannot be removed by the developing step, while the quantum dot material layer 200 in a non-preset area does not crosslink and can be removed by the developing step.

In Step S420, development is performed to remove the quantum dot material layer 200 in a non-preset area. In this step, the developer may refer to the second developer in Example 1 and will not be described in detail herein.

Example 3

As shown in FIG. 22, in this example, Step S400 includes:

Step S410, removing at least a portion of the organic material layer 300 in a preset area and at least a portion of the organic material layer 300 in a non-preset area by a first solvent, wherein the temperature of the first solvent is 60° C.-90° C.;

Step S420, performing the development by the second developer to remove the quantum dot material layer 200 in a non-preset area;

wherein the quantum dot material layer 200 disposed in the preset area undergoes crosslinking or generate salts insoluble in the developer during exposure.

In this example, the organic material layer 300 does not include a photosensitive crosslinking agent, and the quantum dot material layer 200 is a layer with photosensitive crosslinking properties. That is, the organic material layer 300 does not crosslink when exposed.

In Step S410, the organic material layer 300 does not contain a photosensitive crosslinking agent, and therefore, it is not possible to use a conventional developing method removes it. Thus, in this example, the organic material layer 300 is removed using a hot solvent method.

The first solvent may be a non-polar or weakly polar solvent of 60-90° C., such as toluene or petroleum ether or octane at 60° C.-90° C. Specifically, spraying the exposed substrate with the first solvent results in a significant reduction in the thickness of the organic material layer 300 in the pre-determined and non-pre-determined region or in the appearance of some voids.

In Step S420, a second developer is used to develop and remove the quantum dot material layer in a non-preset area. In this step, since the organic material layer 300 is significantly thinned or partially hollowed after Step S410, and the thickness of the thinned layer 300 does not exceed 3 nm, the second developer may penetrate into the quantum dot material layer 200 to remove the quantum dot material layer 200 in the non-preset area. It should be noted herein that the thickness of the organic material layer 300 may vary in different region, with the thickest thickness not exceeding 3 nm.

In this step, the second developer may be referred to Example 1 and will not be described in detail herein.

In the present disclosure, Steps S200 to S400 may be repeated to form the plurality of quantum dot film layers and the organic material layers.

For Example 1 and Example 2, as shown in FIGS. 7 to 14, Steps S200 to S400 are repeated to form the quantum dot film layers 201 and 202, and the organic material layers 301 and 302, wherein the quantum dot material layers 200, 201, and 202 may each be a different color of the quantum dot material. The quantum dot material layer 200 may emit a first color of light, the quantum dot material layer 201 may emit a second color of light, and the quantum dot material layer 202 may emit a third color of light. The first color may be red, the second color may be green, and the third color may be blue, but not limited thereto.

Figure 7:
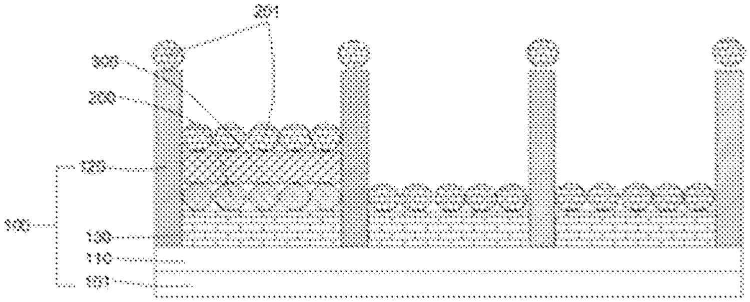
FIG. 7 is a schematic diagram of the structure of forming the quantum dot material layer 201 in an exemplary example of the present disclosure.
Figure 8:
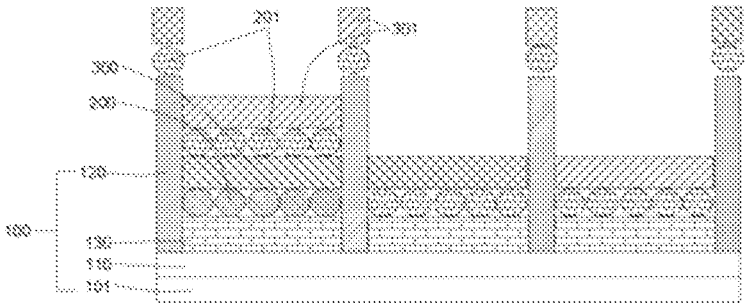
FIG. 8 is a schematic diagram of the structure of forming the organic material layer 301 in an exemplary example of the present disclosure.
Figure 9:
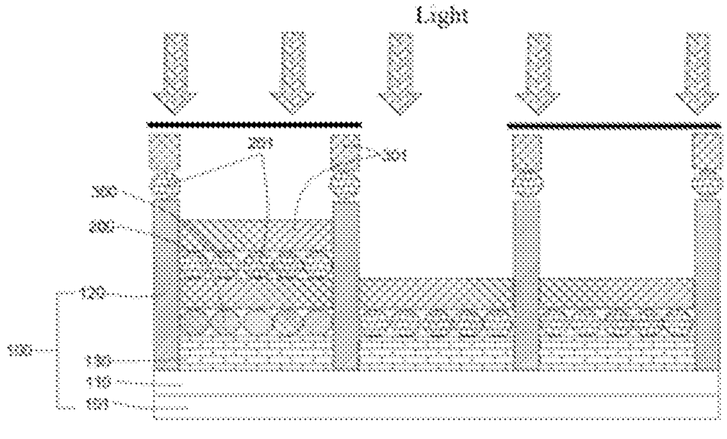
FIG. 9 is a schematic diagram of the exposure structure in an exemplary example of the present disclosure.
Figure 10:
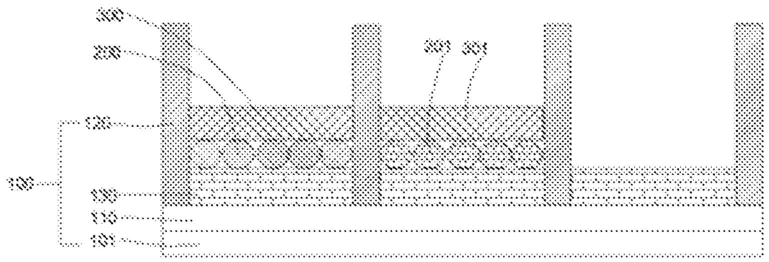
FIG. 10 is a schematic diagram of the structure of removing the organic material layer 301 and the quantum dot material layer 201 from the non-preset area in an exemplary example of the present disclosure.
Figure 11:
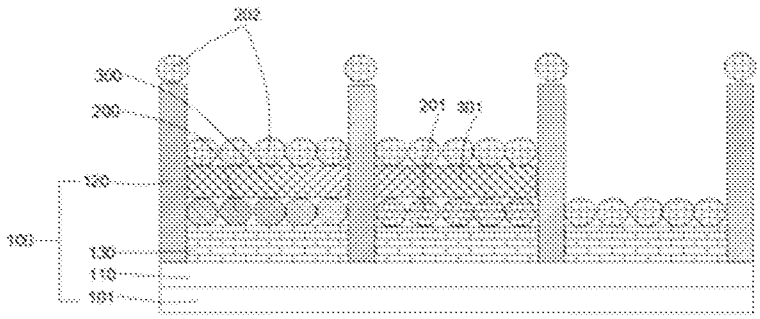
FIG. 11 is a schematic diagram of the structure of forming the quantum dot material layer 202 in an exemplary example of the present disclosure.
Figure 12:
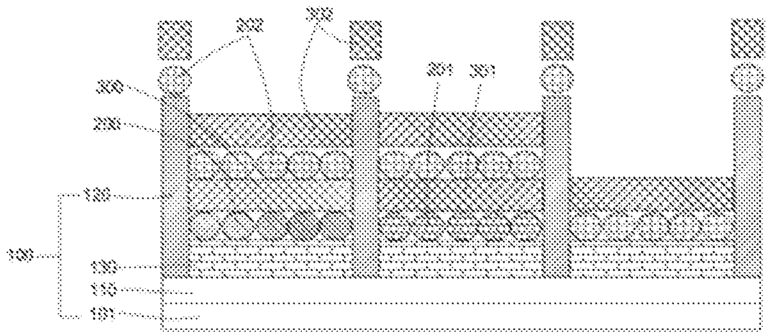
FIG. 12 is a schematic diagram of the structure of forming the organic material layer 302 in an exemplary example of the present disclosure.
Figure 13:
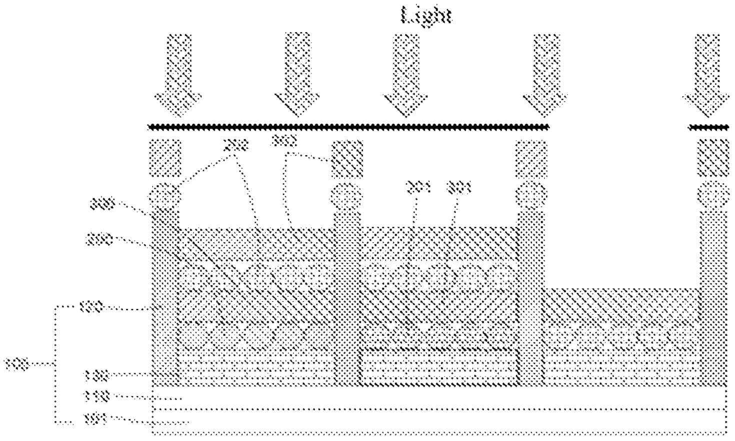
FIG. 13 is a schematic diagram of the exposure structure in an exemplary example of the present disclosure.
Figure 14:
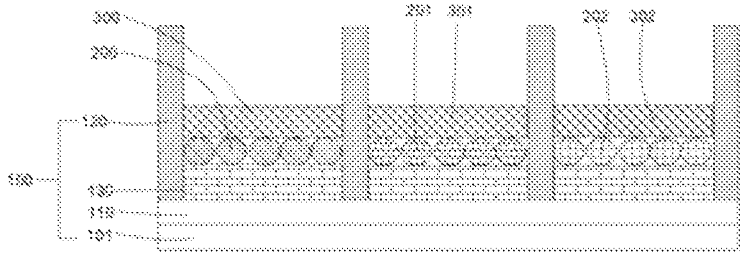
FIG. 14 is a schematic diagram of the structure of that removing the organic material layer 302 and the quantum dot material layer 202 from the non-preset area in an exemplary example of the present disclosure.

Specifically, after the quantum dot material layer 200 and the organic material layer 300 are patterned, the quantum dot material layer 201 is formed on the side of the organic material layer 300 away from the base substrate 101 as shown in FIG. 7, and the organic material layer 301 is formed on the side of quantum dot material layer 201 away from the base substrate 101 as shown in FIG. 8. Then, as shown in FIG. 11, the quantum dot material layer 202 is formed on the side of the organic material layer 301 away from the substrate 101, and an organic material layer 302 is formed on the side of the quantum dot material layer 202 away from the substrate 101, as shown in FIG. 12, and then, as shown in FIGS. 13 and 14, the preset area is exposed to remove the organic material layer 301 and quantum dot material layers 201 in the non-preset area.

Figure 16:
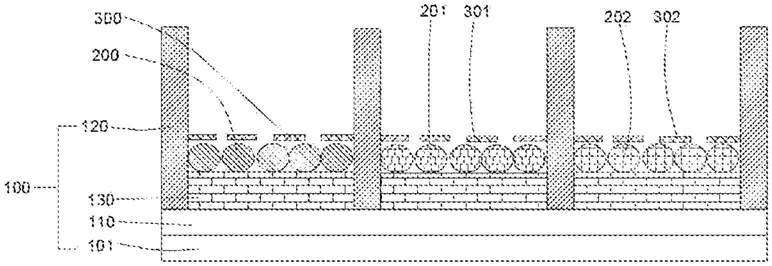
FIG. 16 is a schematic diagram of the structure of the organic material layer after further treatment in another exemplary example of the present disclosure.
Figure 23:
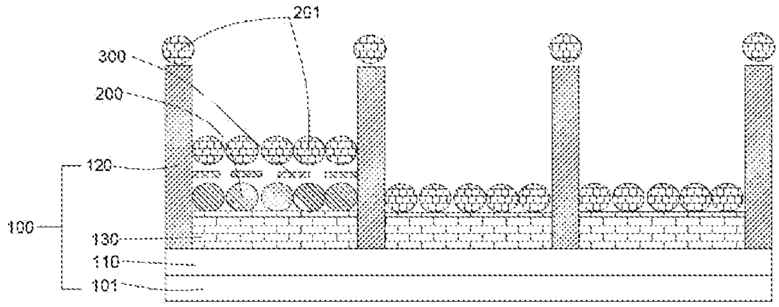
FIG. 23 is a schematic diagram of the structure of forming the quantum dot material layer 201 in another exemplary example of the present disclosure.
Figure 24:
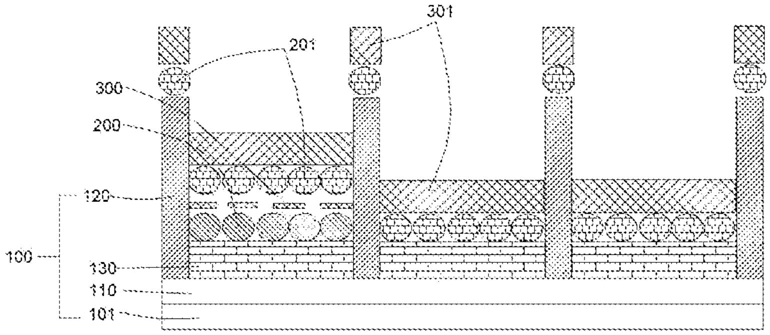
FIG. 24 is a schematic diagram of the structure of forming the organic material layer 301 in another exemplary example of the present disclosure.
Figure 25:
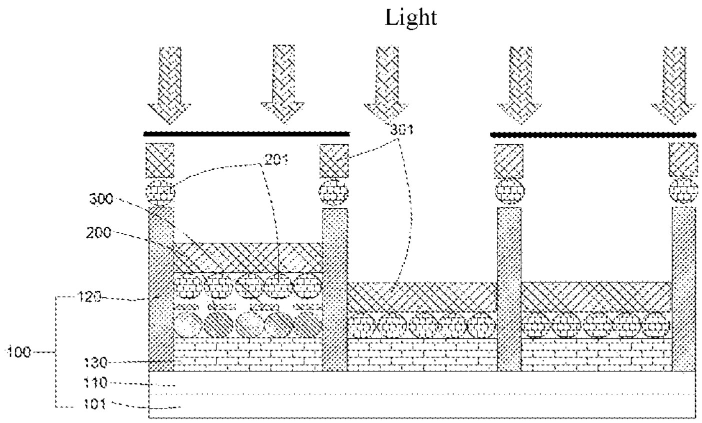
FIG. 25 is a schematic diagram of the exposure structure in another exemplary example of the present disclosure.
Figure 26:
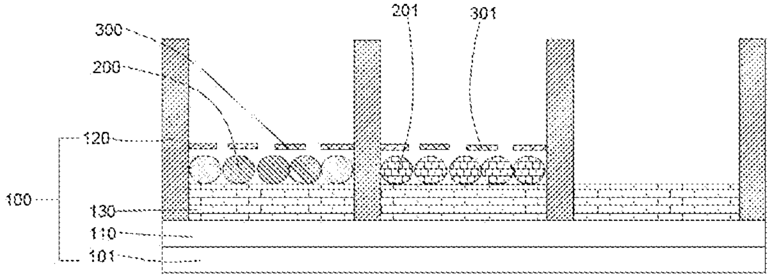
FIG. 26 is a schematic diagram of the structure of removing the organic material layer 301 and the quantum dot material layer 201 from the non-preset area in another exemplary example of the present disclosure.
Figure 27:
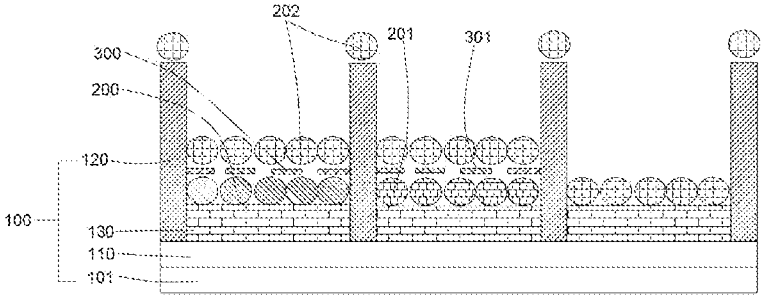
FIG. 27 is a schematic diagram of the structure of the quantum dot material layer 202 in another exemplary example of the present disclosure.
Figure 28:
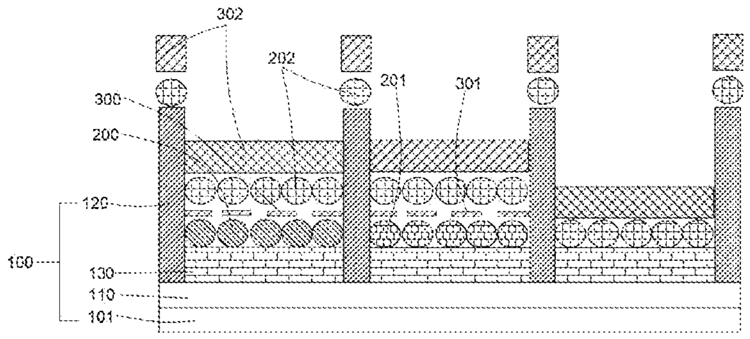
FIG. 28 is a schematic diagram of the structure of the organic material layer 302 in another exemplary example of the present disclosure.
Figure 29:
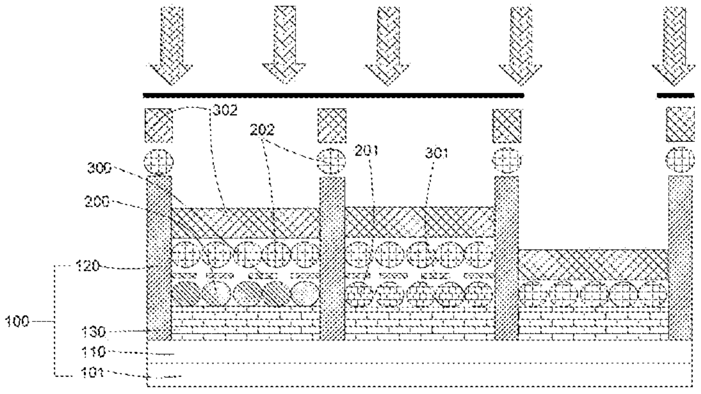
FIG. 29 is a schematic diagram of the exposure structure in another exemplary example of the present disclosure.

For Example 3, Steps S200 to S400 are repeated as shown in FIGS. 23 to 29, and FIG. 16. As shown in FIG. 23, a quantum dot material layer 201 is formed on the side of the organic material layer 300 away from the base substrate 101, and an organic material layer 301 is formed on the side of the quantum dot material layer 201 away from the base substrate 101, as shown in FIG. 24, and the preset area is then exposed as shown in FIGS. 25 and 26, and the organic material layer 301 and the quantum dot material layer 301 are removed from the non-preset area. Next, a quantum dot material layer 202 is formed on the side of the organic material layer 301 away from the substrate 101 as shown in FIG. 27, an organic material layer 302 is formed on the side of the quantum dot material layer 202 away from the substrate 101 as shown in FIG. 28, and the organic material layer 301 and quantum dot material layer 201 are then exposed to the preset area as shown in FIG. 29 and FIG. 16 to remove the organic material layer 301 and quantum dot material layer 202 from the non-preset area.

In the present disclosure, Step S400 may be followed by other steps, as described in detail below in connection with different examples The process after Step S400 is described.

Example 4

As shown in FIGS. 14 to 17, in some examples of the present disclosure, for Example 1 and Example 2, Step S400 is followed by:

Step S500, placing the substrate 100 in horizontal direction, annealing it at 60° C.-100° C. for 5 min-30 min, then cooling it to below 35° C.

In this example, the remaining organic material layer 300 is naturally flattened during the thermal annealing process, resulting in a flatter film layer. At the same time, the small amount of solvent molecules remaining in the quantum dot film layer and the organic material layer 300 can be evaporated, and the final device can be obtained as shown in FIG. 14. In this example, the final thickness of the organic material layer 300 is approximately 8 nm-15 nm.

Example 5

In some examples of the present disclosure, for Example 1 and Example 2, Step S400 is followed by:

Step S500, removing at least a portion of the organic material layer 300 in a preset area by a second solvent, wherein the second solvent has a temperature of 60° C. to 90° C.;

Step S600, heating to dry the substrate 100.

In Step S500, a second solvent is used to soak the substrate or spray the substrate surface, and the remaining organic material layer 300 is rinsed, so that the organic material layer 300 with a certain crosslinking proportion in a preset area is partially removed. The second solvent may be a non-polar solvent or a weakly polar solvent with a temperature of 60° C. to 90° C., such as toluene or petroleum ether or octane with a temperature of 60° C. to 90° C.

Figure 15:
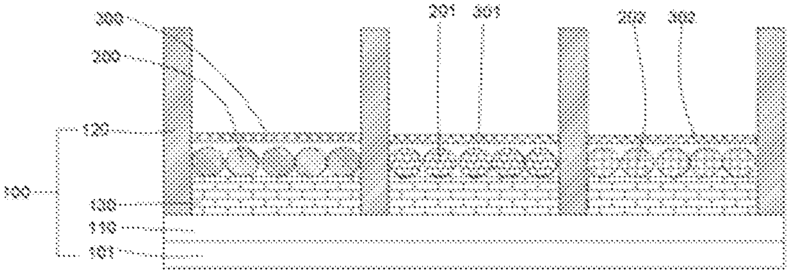
FIG. 15 is a schematic diagram of the structure of the organic material layer after further treatment in an exemplary example of the present disclosure.

In Step S600, the substrate 100 is dried with a hot plate at 70° C.-100° C. to remove residual solvent. The final result is a thinner organic material layer 300 (as shown in FIG. 14), which has a thickness of 3 nm-8 nm or a discontinuous organic material layer 300 (as shown in FIG. 15). The thickness of the organic material layer 300 does not exceed 3 nm, indicating that it is a discontinuous thin film with a thickness not exceeding 3 nm.

In this example, that is, a larger amount of the organic material layer 300 is removed by soaking and spraying with hot solvent to reduce the effect of the organic material layer 300 itself on the electrical properties of the device.

Example 6

In some examples of the present disclosure, for Example 1, Example 2, and Example 3, Step S400 is followed by:

Step S500, heating the substrate and rotating it, rinsing the rotated substrate by a third solvent to remove at least a portion of the remaining organic material layer;

Step S600, heating to dry the substrate.

In Step S500, the substrate is heated to 70° C.-110° C. and then rotated at high speed (e.g. from 1000 rpm to 4000 rpm) in a spin-coater (or screeding machine) at the same ambient temperature, while the surface of the substrate is rinsed with a third solvent at the same or higher temperature (a non-polar solvent or a weakly polar solvent, e.g. toluene or petroleum ether or octane, etc. at 70° C.-110° C.) to substantially remove the organic material layer 300.

Figure 17:
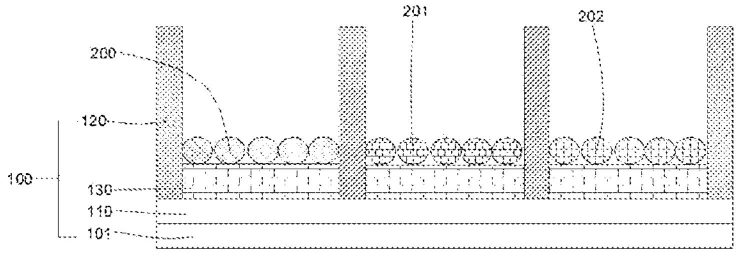
FIG. 17 is a schematic diagram of the structure of the organic material layer after further treatment in another exemplary example of the present disclosure.

In Step S600, the substrate is dried with a hot plate at 70° C.-100° C. to remove residual solvent, as shown in FIG. 17, the final organic material layer 300 is obtained with a thickness of no more than 1 nm.

The present disclosure also provides a quantum dot light emitting layer fabricated using a quantum dot film layer patterning method as in any of the above embodiments. In one embodiment, the quantum dot light emitting layer may include a patterned quantum dot material layer 200, a quantum dot material layer 201, and a quantum dot material layer 202.

The present disclosure also provides a quantum dot light emitting device including the quantum dot light emitting layer described above.

The quantum dot light emitting device provided by the present disclosure may be a photoluminescent quantum dot device or an electroluminescent quantum dot device.

Figure 18:
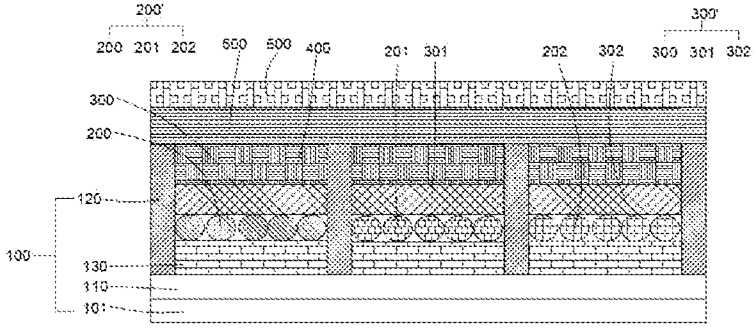
FIG. 18 is a schematic diagram of the structure of forming the quantum dot light emitting device in an exemplary example of the present disclosure.
Figure 19:
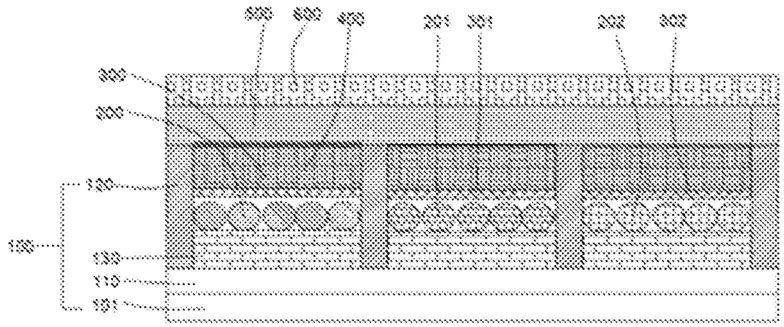
FIG. 19 is a schematic diagram of the structure of forming the quantum dot light emitting device structure in another exemplary example of the present disclosure.
Figure 20:
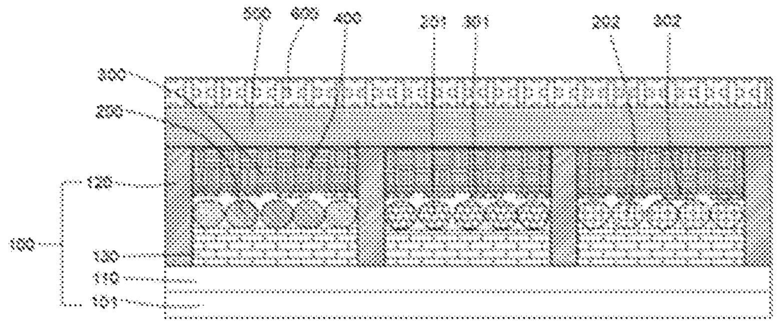
FIG. 20 is a schematic diagram of the structure of forming the quantum dot light emitting device structure in another exemplary example of the present disclosure.
Figure 21:
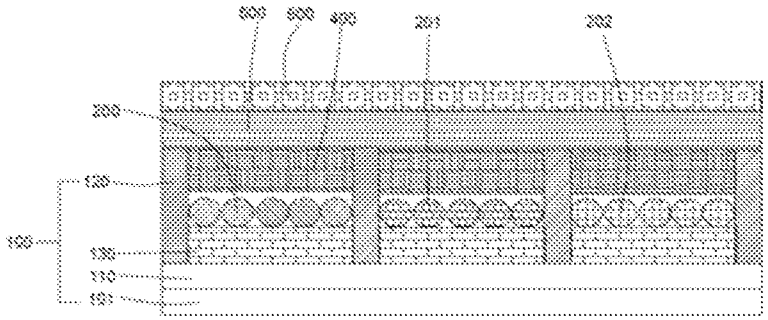
FIG. 21 is a schematic diagram of the structure of forming the quantum dot light emitting device in another exemplary example of the present disclosure.

As shown in FIGS. 18 to 20, in some examples of the present disclosure, the quantum dot light emitting device is an electroluminescent quantum dot device, including:

a base substrate 101;

a pixel definition layer 120, disposed on one side of the substrate 101, wherein the pixel definition layer 120 has a plurality of openings;

a quantum dot light emitting layer 200', disposed on one side of the substrate 101 and disposed within the openings;

an organic layer 300', disposed on one side of the quantum dot light emitting layer 200' away from the substrate 101, wherein the organic layer 300' has a transmittance of not less than 80% in the ultraviolet and visible light bands and the material of the organic layer 300' has a melting temperature of no more than not 110° C.

In this example, the quantum dot light emitting layer 200' is made from the quantum dot material layer 200 in any of the above examples. The quantum dot light emitting device has a quantum dot light emitting layer 200' having a cross-linked network structure, or/and an organic layer 300' having a cross-linked network structure or salts insoluble in the developer. Further, the melting temperature of the material in the organic layer 300' does not exceed 100° C., or does not exceed 90° C., or does not exceed 80° C., and the like. The selection of materials and the formation method of the quantum dot light emitting layer 200' and the organic layer 300' can be referred to the above examples, and will not be discussed in detail herein.

The quantum dot light emitting device further includes a first electrode 110, a first carrier transport layer 130, a second carrier transport layer 400 and a second electrode 500.

The first electrode 110 may be an anode disposed between the substrate 101 and the quantum dot light emitting layer 200'. The first carrier transport layer 130 is disposed between the first electrode 110 and the quantum dot light emitting layer 200', the second carrier transport layer 400 is disposed on the side of the quantum dot light emitting layer 200' away from the substrate 101, the second electrode 500 is disposed on the side of the organic layer 300' away from the base substrate 101, and the second electrode 500 may serve as a cathode.

The anode can include a conductor with high work function, such as a metal, a conductive metal oxide, or a combination thereof. The anode can include, for example, a metal such as nickel, platinum, vanadium, chromium, copper, zinc, or gold, or their alloys; a conductive metal oxide such as zinc oxide, indium oxide, tin oxide, indium tin oxide (ITO), indium zinc oxide (IZO), or fluorine doped tin oxide; or the combination of the metal and the conductive metal oxide such as ZnO and Al, or $SnO_2$ and Sb, but not limited to thereto.

The cathode may include a conductor with a lower work function than the anode, such as a metal, a conductive metal oxide, and/or a conductive polymer. The cathode can include, for example, the metal such as aluminum, magnesium, calcium, sodium, potassium, titanium, indium, yttrium, lithium, gadolinium, silver, tin, lead, cesium, barium, or their alloys; the multilayer structure such as LiF/Al, $Li_2O$/Al, Liq/Al, LiF/Ca, and $BaF_2$/Ca, but not limited to thereto.

The first carrier transport layer 130 may include a hole injection layer and/or hole transport layer along a direction away from the base substrate 101.

The hole transport layer and hole injection layer may each have a HOMO energy level between the work function of the first electrode 110' and the HOMO energy level of the quantum dot film layer 200'. For example, the work function of the first electrode 110', the HOMO level of the hole injection layer, the HOMO level of the hole transport layer, and the HOMO level of the quantum dot film layer 200' can gradually deepen, for example, in a stepped meaner.

The hole transport layer can have a relatively deep HOMO level to match the HOMO level of the quantum dot film layer 200'. Therefore, the migration ratio of holes transferred from the hole transport layer to the quantum dot layer can be improved.

The HOMO energy level of the hole transport layer can be equal to the HOMO energy level of the quantum dot film layer 200' or smaller than the HOMO energy level of the quantum dot film layer 200' within a range of about 1.0 eV or less. For example, the difference between the HOMO energy levels of the hole transport layer and the quantum dot film layer 200' can be about 0 eV to about 1.0 eV, within the range such as about 0.01 eV to about 0.8 eV, within the range such as about 0.01 eV to about 0.7 eV, within the range such as about 0.01 eV to about 0.5 eV, within the range such as about 0.01 eV to about 0.4 eV, such as about 0.01 eV to about 0.3 eV, such as about 0.01 eV to about 0.2 eV, such as about 0.01 eV to about 0.1 eV.

The HOMO energy level of the hole transport layer can be, for example, greater than or equal to about 5.0 eV, within a range such as greater than or equal to about 5.2 eV, within a range such as greater than or equal to about 5.4 eV, within a range such as greater than or equal to about 5.6 eV, and within a range such as greater than or equal to about 5.8 eV.

For example, the HOMO energy level of the hole transport layer can be from about 5.0 eV to about 7.0 eV, within the range such as about 5.2 eV to about 6.8 eV, within the range such as about 5.4 eV to about 6.8 eV, such as about 5.4 eV to about 6.7 eV, such as about 5.4 eV to about 6.5 eV, such as about 5.4 eV to about 6.3 eV, such as about 5.4 eV to about 6.2 eV, such as about 5.4 eV to about 6.1 eV, such as about 5.6 eV to about 7.0 eV, such as about 5.6 eV to about 6.8 eV, such as about 5.6 eV to about 5.6 eV 6.7 eV For example, from about 5.6 eV to about 6.5 eV, from about 5.6 eV to about 6.3 eV, from about 5.6 eV to about 6.2 eV, from about 5.6 eV to about 6.1 eV, from about 5.8 eV to about 7.0 eV, from about 5.8 eV to about 6.8 eV, from about 5.8 eV to about 6.7 eV, from about 5.8 eV to about 6.5 eV, from about 5.8 eV to about 6.3 eV, from about 5.8 eV to about 6.2 eV, from about 5.8 eV to about 6.1 eV.

The hole transport layer and the hole injection layer may include materials that meet energy levels without special restrictions, and may include, for example, at least one selected from the following: poly(9,9-dioctylfluorene-co-N-(4-butylphenyl)-diphenylamine) (TFB), poly(N,N'-bi-4-butylphenyl-N,N'-diphenyl) benzidine (poly TPD), polyarylamine (polyarylamine), poly(N-vinylcarbazole), poly (3,4-ethylenedioxythiophene) (PEDOT), poly (3,4-ethylenedioxythiophene): polystyrene sulronate (PEDOT: PSS), polyaniline, polypyrrole, N,N',N'-tetra(4-methoxy-phenyl)-benzidine (TPD), 4,4'-bis[N-(1-naphthyl)-N-phenyl-amino]biphenyl (α-NPD), m-MTDATA(4,4',4"-tri[phenyl(m-methylphenyl)amino]triphenylamine), 4,4',4"-tri(N-carbazolyl)-triphenylamine (TCTA), 1,1-bis[(di-4-tolylamino)phenyl]cyclohexane (TAPC), p-type metal oxides (such as NiO, $WO_3$, $MoO_3$, etc.), carbon based materials such as graphene oxide, phthalocyanine compounds (such as copper phthalocyanine); N,N'-diphenyl-N, N'-bis-[4-(phenyl-m-methylphenyl amino)-phenyl]-biphenyl-4,4'-diamine (DNTPD), 4,4',4"-tri(3-methylphenylphenylamino) triphenylamine (m-MTDATA), 4,4',4"-tri(N,N-diphenylamino) triphenylamine (TDATA), 4,4',4"-tri{N-(2-naphthyl)-N-phenylamino}-triphenylamine (2-TNATA), poly(3,4-ethylenedioxythiothiophene)/poly(4-styrylsulfonate) (PEDOT/PSS) polyaniline/dodecylbenzenesulphonic acid (PANI/DBSA), polyaniline/camphorsulfonic acid (PANI/CSA), polyaniline/poly(4-phenylenesulfonat) (PANI/PSS), N,N'-bis (naphthalen-1-yl)-N,N'-diphenyl-benzidine (NPB), polyetherketone containing triphenylamine (TPAPEK), 4-isopropyl-4'-methyldiphenyliodiumtetra(pentafluorophenyl) borate and/or dipyrazino[2,3-f:2',3'-h]quinoline oxaline-2,3,6,7,10,11-hexacyanonitrile (HAT-CN), carbazole derivatives (such as N-phenylcarbazole and/or polyvinylcarbazole), fluorine derivatives, N,N'-bis(3-methylphenyl)-N,N'-diphenyl-[1,1-biphenyl]-4,4'-diamine (TPD), triphenylamine derivatives (such as 4,4',4"-tri(N-carbazolyl) triphenylamine (TCTA)), N,N'-bis(naphthalen-1-yl)-N,N'-diphenylbenzidine (NPB), 4,4'-cyclohexylidenebis[N,N-bis(4-methylphenyl)aniline] (TAPC), 4,4'-bis[N,N'-(3-methylamino)-3,3'-dimethylbiphenyl (HMTPD), 1,3-bis(N-carbazolyl)benzene (mCP) and their combinations, but not limited to thereto.

One or both of the hole transport layer and hole injection layer can be omitted.

The second carrier transport layer 400 may include an electron transport layer and an electron injection layer sequentially disposed in the direction away from the substrate 101.

For example, the LUMO energy levels of the second electrode 500, electron injection layer, electron transport layer, and quantum dot film layer 200' can gradually become shallower. For example, the LUMO level of the electron injection layer can be shallower than the work function of the second electrode 500, and the LUMO level of the electron transfer layer can be shallower than the LUMO level of the electron injection layer, and the LUMO level of the quantum dot film layer 200' can be shallower than the LUMO level of the electron transfer layer. That is, the work function of the second electrode 500, the LUMO energy level of the electron injection layer, the LUMO energy level of the electron transfer layer, and the LUMO energy level of the quantum dot film layer 200' may have a gradually decreasing, along one direction (cascading energy level).

The electron transport layer may include a first inorganic nanoparticle. The first inorganic nanoparticle can be, for example, an oxide nanoparticle, and can be, for example, a metal oxide nanoparticle.

The first inorganic nanoparticle can be two-dimensional or three-dimensional nanoparticle with an average particle diameter of less than or equal to about 10 nm, within a range of less than or equal to about 8 nm, less than or equal to about 7 nm, less than or equal to about 5 nm, less than or equal to about 4 nm, or less than or equal to about 3.5 nm, or within a range of about 1 nm to about 10 nm, about 1 nm to about 9 nm, about 1 nm to about 8 nm, about 1 nm to about 7 nm, about 1 nm to about 5 nm, about 1 nm to about 4 nm Or about 1 nm to about 3.5 nm.

For example, the first inorganic nanoparticle can be a metal oxide nanoparticle, which include at least one of the following: zinc (Zn), magnesium (Mg), cobalt (Co), nickel (Ni), gallium (Ga), aluminum (Al), calcium (Ca), zirconium (Zr), tungsten (W), lithium (Li), titanium (Ti), tantalum (Ta), tin (Sn), hafnium (Hf), and barium (Ba).

As an example, the first inorganic nanoparticle may include a metal oxide nanoparticle containing zinc (Zn), and may include a metal oxide nanoparticle represented by Zn1-xQxO ($0 \le x < 0.5$). Here, Q refers to at least one metal different from Zn, such as magnesium (Mg), cobalt (Co), nickel (Ni), gallium (Ga), aluminum (Al), calcium (Ca), zirconium (Zr), tungsten (W), lithium (Li), titanium (Ti), tantalum (Ta), tin (Sn), hafnium (Hf), silicon (Si), barium (Ba), or a combination thereof.

For example, Q can include magnesium (Mg).

For example, x can be within the range of $0.01 \le x \le 0.3$, for example, $0.01 \le x$ $C \le 0.2$.

The LUMO energy level of the electron transfer layer 16 can be a value between the LUMO energy level of quantum dot film layer 200' and the LUMO energy level of electron injection layer 17, and can be about 3.2 eV to about 4.8 eV, about 3.2 eV to about 4.6 eV, about 3.2 eV to about 4.5 eV, about 3.2 eV to about 4.3 eV, about 3.2 eV to about 4.1 eV, about 3.4 eV to about 4.1 eV, about 3.5 eV to about 4.6 eV, about 3.6 eV to about 4.6 eV, about 3.6 eV to about 4.3 eV, about 3.6 eV to about 4.1 eV, about 3.6 eV to about 3.9 eV, about 3.7 eV to about 4.6 eV, about 3.7 eV to about 4.3 eV, about 3.7 eV to about 4.1 eV, or about 3.7 eV to about 3.9 eV.

The thickness of the electron transport layer can be greater than about 10 nm and less than or equal to about 80 nm, and within the range, greater than about 10 nm and less than or equal to about 70 nm, greater than about 10 nm and less than or equal to about 60 nm, greater than about 10 nm and less than or equal to about 50 nm, greater than about 10 nm and less than or equal to about 40 nm, or greater than about 10 nm and less than or equal to about 30 nm.

The LUMO energy level of the electron injection layer can be between the work function of the second electrode 500 and the LUMO energy level of the electron transfer layer. For example, the difference between the work function of the second electrode 500 and the LUMO energy level of the electron injection layer can be less than about 0.5 eV, about 0.001 eV to about 0.5 eV, about 0.001 eV to about 0.4 eV, or about 0.001 eV to about 0.3 eV As an example, the difference between the LUMO energy level of the electron injection layer and the LUMO energy level of the electron transfer layer can be less than about 0.5 eV, about 0.001 eV to about 0.5 eV, about 0.001 eV to about 0.4 eV, or about 0.001 eV to about 0.3 eV. Therefore, electrons can be easily injected from the second electrode 500 into the electron injection layer to reduce the driving voltage of the quantum dot device, and electrons can be effectively transferred from the electron injection layer to the electron transport layer to improve efficiency. The LUMO energy levels of the electron injection layer can be about 3.4 eV to about 4.8 eV, about 3.4 eV to about 4.6 eV, about 3.4 eV to about 4.5 eV, about 3.6 eV to about 4.8 eV, about 3.6 eV to about 4.6 eV, about 3.6 eV to about 4.5 eV, about 3.6 eV to about 4.3 eV, about 3.9 eV to about 4.8 eV, about 3.9 eV to about 4.6 eV, about 3.9 eV to about 4.5 eV, or about 3.9 eV to about 4.3 eV, within a range satisfying the aforementioned energy level.

The electron injection layer can be thinner than the electron transport layer. For example, the thickness of the electron injection layer can be about 0.01 to about 0.8 times, about 0.01 to about 0.7 times, about 0.01 to about 0.5 times, about 0.1 to about 0.8 times, about 0.1 to about 0.7 times, or about 0.1 to about 0.5 times the thickness of the electron transfer layer. The thickness of the electron injection layer 17 can be, for example, less than or equal to about 10 nm, less than or equal to about 7 nm, or less than or equal to about 5 nm. Within the range, the thickness of the electron injection layer 17 can be about 1 nm to about 10 nm, about 1 nm to about 8 nm, about 1 nm to about 7 nm, or about 1 nm to about 5 nm.

In some examples of the present disclosure, the organic layer 300' has a thickness of no more than 20 nm. in other examples, the organic layer 300' has a thickness of no more than 3 nm and the organic layer 300' is a discontinuous film layer with a plurality of pores within a single opening. The organic layer 300' is made from the organic material layer 300 in the above examples. Further, the material of the organic layer 300' contains the wax.

Furthermore, the quantum dot light emitting device may also include an encapsulating layer 600, specifically, after the above Step S600, as shown in FIGS. 18 to 21, the second carrier transmission layer 400, the second electrode 500 may be further formed, and then encapsulation may be completed to form the encapsulating layer 600. Thus, the quantum dot light emitting device may be fabricated.

In other examples, the quantum dot light emitting device is a photoluminescent quantum dot device. The quantum dot device further includes a plurality of light emitting units disposed between the substrate 101 and the quantum dot light emitting layer 200'. Each light emitting unit may correspond to an opening of the pixel definition layer 120. The light emitted by the light emitting units may cause the quantum dot light emitting layer 200' to emit light. The light emitting unit may be an OLED light emitting device, the specific structure of which will not be described in detail herein.

It is to be noted that although the various steps of the method in the present disclosure are described in the accompanying drawings in a particular order, it is not required or implied that the steps must be performed in that particular order, or that all of the shown steps in order to achieve the desired result. Additional or alternatively, omitting certain steps, combining multiple steps into a single step, and/or breaking down a step into multiple steps, etc., should be considered part of the present disclosure.

It should be understood that the present disclosure does not limit its application to the detailed structure and arrangement of the components presented herein. The present disclosure can other embodiments and can be realized and performed in a variety of ways. The foregoing variations forms and modifications fall within the scope of the present disclosure. It should be understood that the present disclosure, as disclosed and limited in this specification, extends to all alternative combinations of two or more individual features mentioned or developer in the text and/or in the accompanying drawings. All of these various combinations constitute multiple alternative aspects of the present disclosure. The embodiments of this specification illustrate the best known ways of accomplishing the present disclosure and will enable those skilled in the art to utilize the present disclosure.

What is claimed is:

1. A quantum dot film layer patterning method, comprising:

forming a quantum dot material layer on a side of a substrate;

forming an organic material layer on one side of the quantum dot material layer away from the substrate, wherein the organic material layer has a transmittance of not less than 80% in UV and visible light bands;

exposing a preset area of the substrate to cause crosslinking of the material in the preset area of the quantum dot material layer or the generation of salts insoluble in the developer, or/and to cause crosslinking of the material in the preset area of the organic material layer;

removing the organic material layer and the quantum dot material layer from a non-preset area of the substrate.

2. The quantum dot film layer patterning method according to claim 1, wherein the material of the organic layer comprises a hydrocarbon mixture with 18-30 carbon atoms.

3. The quantum dot film layer patterning method according to claim 2, wherein the material of the organic material layer further comprises a first photosensitive crosslinking agent.

4. The quantum dot film layer patterning method according to claim 2, wherein the hydrocarbon mixture comprises 80-100% by weight of straight chain alkane and 0-20% by weight of other hydrocarbons, the other hydrocarbons comprising branched alkanes, cycloalkanes, olefins, alkynes or a combination thereof.

5. The quantum dot film layer patterning method according to claim 3, wherein the photosensitive crosslinking agent accounts for 1-30% by weight of the hydrocarbon mixture.

6. The quantum dot film layer patterning method according to claim 1, wherein the material of the organic material layer comprises waxes.

7. The quantum dot film layer patterning method according to claim 1, wherein the material of the organic material layer has an initial melting temperature of not more than 60° C.

8. The quantum dot film layer patterning method according to claim 1, wherein the organic material layer has an initial thickness of 20 nm-80 nm.

9. The quantum dot film layer patterning method according to claim 1, wherein the material of the quantum dot material layer comprises a first quantum dot body, a second quantum dot body, a quantum dot ligand, and a second photosensitive crosslinking agent;

the quantum dot ligand is connected to the first quantum dot body or/and the second quantum dot body via a coordination bond;

the quantum dot ligand comprises a first photosensitive group at the terminal of the molecular structure of the quantum dot ligand, and the second photosensitive crosslinking agent is used to induce crosslinking reaction of the first photosensitive group.

10. The quantum dot film layer patterning method according to claim 9, wherein the first photosensitive group comprises a carbon-carbon double bond, or a saturated 3 to 5-membered heterocyclic structure containing O or S.

11. The quantum dot film layer patterning method according to claim 1, wherein the material of the quantum dot material layer comprises a first quantum dot body, a second quantum dot body, a quantum dot ligand, and a photosensitive initiator;

the quantum dot ligand comprises a first quantum dot ligand and a second quantum dot ligand, the first quantum dot ligand is connected to the first quantum dot body via a coordination bond and the second quantum dot ligand is connected to the second quantum dot body via a coordination bond;

the first quantum dot ligand comprises a cross-linkable group at the terminal of the molecular structure of the first quantum dot ligand, and the second quantum dot ligand comprises a second photosensitive group with a structure of -A-B, wherein A is an imino group and B is a protective group;

under light conditions, the second photosensitive group can remove the protective group to form an amino group under the action of the photosensitive initiator; the cross-linkable group can form crosslinking or salts insoluble in the developer with the amino group formed by removing the protective group from the second photosensitive group; or the cross-linkable group can be activated by an activator to form crosslinking or salts insoluble in developer with the amino group formed by removing the protective group from the second photosensitive group.

12. The quantum dot film layer patterning method according to claim 11, wherein the cross-linkable group is selected from an epoxy group, a carboxylic acid group or a sulfonic acid group.

13. The quantum dot film layer patterning method according to claim 1, wherein the material of the quantum dot material layer comprises a quantum dot body and a quantum dot ligand, the quantum dot ligand comprises a coordination group, and the quantum dot ligand is connected to the quantum dot body by the coordination group;

the quantum dot ligand comprises a structure of —Y—Z, wherein Z is a solubility group, and the solubility group is selected from polar groups; Y comprises an interconnected connecting group and a third photosensitive group, and the connecting group is connected between the coordination group and the third photosensitive group; the connecting group is selected from alkylene groups;

the third photosensitive group can undergo bond breaking under light conditions to decompose the interconnected quantum dot body and quantum dot ligand into a first material containing the interconnected quantum dot body, the coordination group, and the connecting group, as well as a second material containing the solubility group;

the second material can dissolve in the developer and the first material is insoluble in the developer.

14. The quantum dot film layer patterning method according to claim 1, wherein the material of the quantum dot material layer comprises a first quantum dot body, a second quantum dot body, a quantum dot ligand, and a third photosensitive crosslinking agent;

the quantum dot ligand is connected to the first quantum dot body or/and the second quantum dot body via a coordination bond, and the quantum dot ligand contains an alkane chain;

the third photosensitive crosslinking agent comprises at least two fourth photosensitive groups at the terminal of the molecular structure of the third photosensitive crosslinking agent;

the fourth photosensitive group can undergo a hydrocarbon insertion reaction with the alkane chain in the quantum dot ligand under light conditions.

15. The quantum dot film layer patterning method according to claim 14, wherein the fourth photosensitive group is selected from a structure containing a benzophenone group, an azide group, a diazo group, or a diazirine group.

16. The quantum dot film layer patterning method according to claim 1, wherein the material of the quantum dot material layer comprises a quantum dot body and at least one quantum dot ligand, and the quantum dot ligand is connected to the quantum dot body via a coordination bond;

at least one of the quantum dot ligands comprises an alkane chain in their molecular structure.

17. The quantum dot film layer patterning method according to claim 1, wherein the quantum dot material layer and the organic material layer are formed in an inert gas or in a vacuum environment;

the step of exposing the preset area of the substrate is performed in an atmospheric environment.

18. The quantum dot film layer patterning method according to claim 1, wherein the step of removing the organic material layer and the quantum dot material layer from the non-preset area of the substrate comprises:

developing to remove the organic material layer and the quantum dot material layer from the non-preset area;

wherein the organic material layer in the preset area undergoes crosslinking during exposure.

19. The quantum dot film layer patterning method according to claim 18, wherein developing to remove the organic material layer and the quantum dot material layer from the non-preset area of the substrate comprises:

performing a first development by a first developer to remove the organic material layer from the non-preset area;

performing a second development by a second developer to remove the quantum dot material layer from the non-preset area;

wherein the first developer is different from the second developer.

20. The quantum dot film layer patterning method according to claim 1, wherein the step of removing the organic material layer and the quantum dot material layer from the non-preset area of the substrate comprises:

heating the non-preset area, and rotating the substrate to melt the organic material layer in the non-preset area and remove the melted organic material layer under the action of centrifugal force;

developing to remove the quantum dot material layer in the non-preset area;

wherein the quantum dot material layer in the preset area undergoes crosslinking or generates salts insoluble in the developer during exposure.

21. The quantum dot film layer patterning method according to claim 1, wherein the step of removing the organic material layer and the quantum dot material layer from the non-preset area of the substrate comprises:

removing at least part of the organic material layer in the preset area and at least part of the organic material layer in the non-preset area by a first solvent, wherein the first solvent is at a temperature of 60° C.-90° C.;

developing to remove the quantum dot material layer in the non-preset area by a second developer;

wherein the quantum dot material layer in the preset area undergoes crosslinking or generates salts insoluble in the developer during exposure.

22. The quantum dot film layer patterning method according to claim 19, wherein the temperature of the first developer is less than 60° C.;

the relative dielectric constant of the second developer is greater than the relative dielectric constant of the first developer.

23. The quantum dot film layer patterning method according to claim 20, wherein the temperature for heating the non-preset area is 70° C.-110° C.

24. The quantum dot film layer patterning method according to claim 21, wherein after being treated with the first solvent, the thickness of the organic material layer is not greater than 3 nm, or pores appear in the organic material layer.

25. The quantum dot film layer patterning method according to claim 18, wherein the step of removing the organic material layer and the quantum dot material layer from the non-preset area of the substrate further comprises:

placing the substrate in horizontal direction, annealing it at 60° C.-100° C. for 5 min-30 min, then cooling it to below 35° C.

26. The quantum dot film layer patterning method according to claim 18, wherein after the step of removing the organic material layer and the quantum dot material layer from the non-preset area of the substrate, the method further comprises:

removing at least a portion of the organic material layer from the preset area by a second solvent, wherein the second solvent is at a temperature of 60° C.-90° C.;

heating to dry the substrate.

27. The quantum dot film layer patterning method according to claim 18, wherein after the step of removing the organic material layer and the quantum dot material layer from the non-preset area of the substrate, the method further comprises:

heating the substrate and rotating it, rinsing the rotated substrate by a third solvent to remove at least a portion of the remaining organic material layer, wherein the third solvent is at a temperature of 70° C.-110° C.;

heating to dry the substrate.

28. The quantum dot film layer patterning method according to claim 5, wherein the first photosensitive crosslinking agent molecular structure contains at least two fifth photosensitive groups at the terminal of the molecular structure of the first photosensitive crosslinking agent;

the fifth photosensitive group is selected from a structure containing a benzophenone group, an azide group, a diazo group, or a diazirine group.

29. The quantum dot film layer patterning method according to claim 1, wherein the substrate comprises:

a base substrate;

a pixel definition layer disposed on one side of the base substrate, wherein the pixel definition layer has a plurality of openings, and the quantum dot material layer is at least partially formed within openings;

wherein in a direction perpendicular to the base substrate, the pixel definition layer has a height of no more than 1.5 μm.

30. The quantum dot film layer patterning method according to claim 20, wherein the step of removing the organic material layer and the quantum dot material layer from the non-preset area of the substrate further comprises:

placing the substrate in horizontal direction, annealing it at 60° C.-100° C. for 5 min-30 min, then cooling it to below 35° C.

31. The quantum dot film layer patterning method according to claim 20, wherein after the step of removing the organic material layer and the quantum dot material layer from the non-preset area of the substrate, the method further comprises:

removing at least a portion of the organic material layer from the preset area by a second solvent, wherein the second solvent is at a temperature of 60° C.-90° C.;

heating to dry the substrate.

32. The quantum dot film layer patterning method according to claim 20, wherein after the step of removing the organic material layer and the quantum dot material layer from the non-preset area of the substrate, the method further comprises:

heating the substrate and rotating it, rinsing the rotated substrate by a third solvent to remove at least a portion of the remaining organic material layer, wherein the third solvent is at a temperature of 70° C.-110° C.;

heating to dry the substrate.

33. The quantum dot film layer patterning method according to claim 21, wherein after the step of removing the organic material layer and the quantum dot material layer from the non-preset area of the substrate, the method further comprises:

heating the substrate and rotating it, rinsing the rotated substrate by a third solvent to remove at least a portion of the remaining organic material layer, wherein the third solvent is at a temperature of 70° C.-110° C.;

heating to dry the substrate.

34. A quantum dot light emitting device, comprising:

a base substrate;

a pixel definition layer on one side of the substrate, wherein the pixel definition layer has a plurality of openings;

a quantum dot light emitting layer on one side of the substrate and within openings;

an organic layer on one side of the quantum dot light emitting layer away from the base substrate, wherein the organic layer has a transmittance of not less than 80% in the ultraviolet and visible light bands, and the material in the organic layer has a melting temperature of no more than 110° C.

35. The quantum dot light emitting device according to claim 34, wherein the organic layer has a thickness of no more than 20 nm.

36. The quantum dot light emitting device according to claim 34, wherein the organic layer has a thickness of no more than 3 nm and the organic material layer within each opening is a discontinuous film layer having a plurality of pores.

37. The quantum dot light emitting device according to claim 34, wherein the material of the organic layer comprises waxes.

38. The quantum dot light emitting device according to claim 34, wherein the quantum dot light emitting layer has a cross-linked network structure, or/and the organic layer has a cross-linked network structure or salts insoluble in the developer.

39. The quantum dot light emitting device according to claim 34, wherein the quantum dot light emitting device further comprises a first electrode, a second electrode, a first carrier transport layer, and a second carrier transport layer;

the first electrode is disposed between the base substrate and the quantum dot light emitting layer, and the first carrier transport layer is disposed between the first electrode and the quantum dot light emitting layer;

the second carrier transport layer is disposed on a side of the organic layer away from the base substrate, and the second electrode is disposed on a side of the second carrier transport layer away from the base substrate.

* * * * *